(12) United States Patent
Son et al.

(10) Patent No.: US 10,495,931 B2
(45) Date of Patent: Dec. 3, 2019

(54) DISPLAY DEVICE

(71) Applicant: Samsung Display Co., Ltd., Yongin-Si, Gyeonggi-Do (KR)

(72) Inventors: Jeongman Son, Suwon-si (KR); Jong-keun Kim, Seoul (KR); Jikhan Jung, Seoul (KR); Seung-won Kuk, Cheonan-si (KR); Donghee Ye, Daegu (KR); Yun-gun Lee, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/397,311

(22) Filed: Apr. 29, 2019

(65) Prior Publication Data

US 2019/0250449 A1 Aug. 15, 2019

Related U.S. Application Data

(62) Division of application No. 15/617,328, filed on Jun. 8, 2017, now Pat. No. 10,324,343.

(30) Foreign Application Priority Data

Sep. 7, 2016 (KR) .................. 10-2016-0115216

(51) Int. Cl.
*H01L 21/00* (2006.01)
*G02F 1/1345* (2006.01)
(Continued)

(52) U.S. Cl.
CPC ........... *G02F 1/13452* (2013.01); *G09G 3/20* (2013.01); *H01L 24/05* (2013.01); *H01L 25/18* (2013.01); *H01L 27/124* (2013.01); *G02F 2201/121* (2013.01); *G09G 3/3648* (2013.01); *G09G 3/3674* (2013.01); *G09G 3/3685* (2013.01); *G09G 2300/0408* (2013.01); *G09G 2300/0413* (2013.01); *G09G 2300/0426* (2013.01); *H01L 24/32* (2013.01); *H01L 27/3223* (2013.01);
(Continued)

(58) Field of Classification Search
None
See application file for complete search history.

(56) References Cited

U.S. PATENT DOCUMENTS

| 2008/0123005 A1* | 5/2008 | Sohn ............... G02F 1/1309 349/40 |
| 2018/0061367 A1* | 3/2018 | Ye .................. G09G 3/3406 |
| 2019/0094633 A1* | 3/2019 | Song ............... G02F 1/133514 |

FOREIGN PATENT DOCUMENTS

| KR | 1020050091290 A | 9/2005 |
| KR | 1020140136237 A | 11/2014 |

(Continued)

*Primary Examiner* — Reema Patel
(74) *Attorney, Agent, or Firm* — Cantor Colburn LLP

(57) ABSTRACT

A display device includes: a display panel including a top surface, a bottom surface facing the top surface, and a plurality of side surfaces which connects the top surface to the bottom surface; a plurality of data driving units disposed on a first side surface of the side surfaces; a plurality of gate driving units disposed on a second side surface of the side surfaces, which is connected to the first side surface, and a first control signal line disposed on the first and second side surfaces, in which the first control signal line connects a first adjacent data driving unit of the data driving units, which is disposed adjacent to the second side surface, to the first gate driving units.

5 Claims, 18 Drawing Sheets

(51) Int. Cl.
*H01L 27/12* (2006.01)
*H01L 23/00* (2006.01)
*G09G 3/20* (2006.01)
*H01L 25/18* (2006.01)
*H05K 3/32* (2006.01)
*G09G 3/36* (2006.01)
*H01L 27/32* (2006.01)
*H05K 1/11* (2006.01)
*H05K 3/36* (2006.01)

(52) U.S. Cl.
CPC .............................. *H01L 27/3276* (2013.01); *H01L 2224/32013* (2013.01); *H01L 2224/32145* (2013.01); *H05K 1/117* (2013.01); *H05K 3/323* (2013.01); *H05K 3/361* (2013.01)

(56) References Cited

FOREIGN PATENT DOCUMENTS

| | | |
|---|---|---|
| KR | 1020150011731 A | 2/2015 |
| KR | 1020150047711 A | 5/2015 |
| KR | 1020150074275 A | 7/2015 |

* cited by examiner

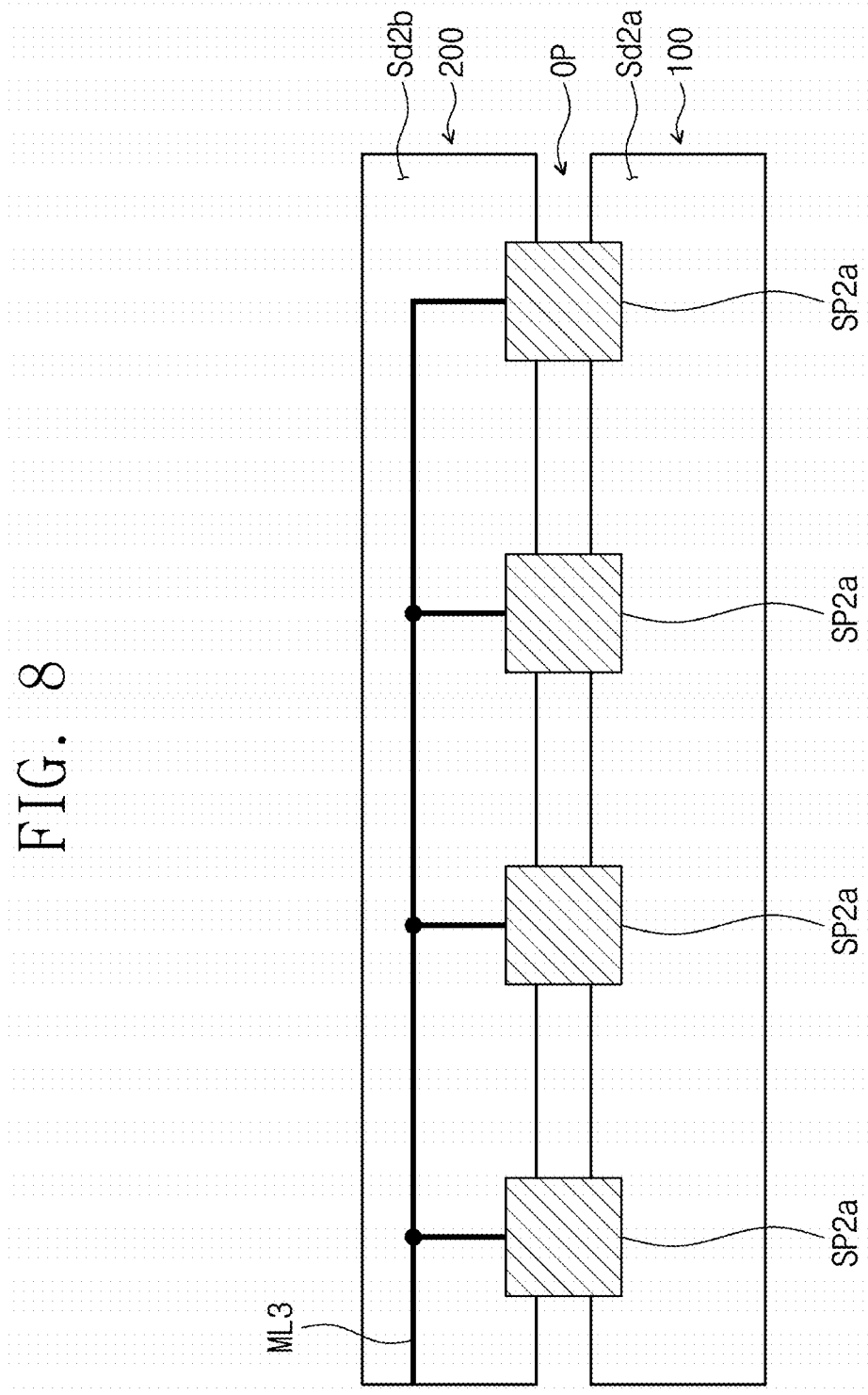

DISPLAY DEVICE

This application is a divisional of U.S. patent application Ser. No. 15/617,328, filed on Jun. 8, 2017, which claims priority to Korean Patent Application No. 10-2016-0115216, filed on Sep. 7, 2016, and all the benefits accruing therefrom under 35 U.S.C. § 119, the content of which in its entirety is herein incorporated by reference.

BACKGROUND

1. Field

The disclosure herein relates to a display device, and more particularly, to a display device in which a driving unit is disposed on a side surface of a display panel.

2. Description of the Related Art

In general, module assembly equipment, which is a post-processing facility for a display panel of a display device, performs a process of electrically connecting a display panel to a driving chip, and a chip on glass ("COG") mounting method or a tape automated bonding ("TAB") mounting method is typically used to mount the driving chip in the above-described connecting process.

The COG mounting method is a method of directly mounting the driving chip on a gate area and a data area of the display panel to transmit an electrical signal to the display panel. In general, an anisotropic conductive film ("ACF") is used to bond the driving chip to the display panel.

The TAB mounting method is a method of bonding a tape carrier package on which the driving chip is mounted to the display panel. In the TAB mounting method, the anisotropic conductive film may be used to bond one end of the tape carrier package to the display panel and the other end thereof to a main circuit board.

SUMMARY

The disclosure provides a display device having a reduced non-display area and an increased display area by having a structure in which the tape carrier package is disposed on a side surface of the display panel.

In an embodiment of the invention, a display device includes: a display panel including a top surface, a bottom surface facing the top surface, and a plurality of side surfaces which connects the top surface to the bottom surface; a plurality of data driving units disposed on a first side surface of the side surfaces; a plurality of first gate driving units disposed on a second side surface of the side surfaces, which is connected to the first side surface; and a first control signal line disposed on the first and second side surfaces, where the first control signal line connects a first adjacent data driving unit of the data driving units, which is disposed adjacent to the second side surface, to the first gate driving units.

In an embodiment, the first control signal line may include a first sub-control signal line disposed on the first and second side surfaces and a plurality of second sub-control signal lines disposed on the second side surface.

In an embodiment, the first sub-control signal line may connect an adjacent first gate driving unit of the first gate driving units, which is disposed adjacent to the first side surface, to the first adjacent data driving unit, and the second sub-control signal lines may connect the remaining first gate driving units of the first gate driving units to each other.

In an embodiment, the display device may further include a plurality of second gate driving units disposed on a third side surface of the side surfaces, which is connected to the first side surface of the side surfaces; and a second control signal line disposed on the first and third side surfaces, where the second control signal line connects a second adjacent data driving unit of the data driving units, which is disposed adjacent to the third side surface, to the second gate driving units.

In an embodiment, the second control signal line may include a third sub-control signal line disposed on the first and third side surfaces and a plurality of fourth sub-control signal lines disposed on the third side surface.

In an embodiment, the display panel may include a first substrate and a second substrate disposed opposite to the first substrate. In such an embodiment, each of the first gate driving units may have an end portion disposed on a first sub-side surface of the second side surface, which corresponds to the first substrate, and an opposing end portion disposed on a second sub-side surface of the second side surface, which corresponds to the second substrate.

In an embodiment, the first control signal line may be disposed on one sub-side surface of the first and second sub-side surfaces.

In an embodiment, the first control signal line may have one portion disposed on the first sub-side surface and the other portion disposed on the second sub-side surface.

In an embodiment, the one portion of the first control signal line may connect an adjacent first gate driving unit of the first gate driving units, which is disposed adjacent to the first side surface, to the first adjacent data driving unit, and the other portion of the first control signal line may connect the remaining gate driving units of the first gate driving units to each other.

In an embodiment, the display device may further include a side common electrode disposed on a third side surface of the side surfaces, which is connected to the first side surface; and a common power line disposed on the first and third side surfaces to connect a second adjacent data driving unit of the data driving units, which is disposed adjacent to the third side surface, to the side common electrode.

In an embodiment, the display panel may include: a first substrate including a plurality of pixels; and a second substrate disposed on the first substrate and in which a common electrode is disposed. In such an embodiment, the side common electrode may be connected to the common electrode.

In an embodiment, the side common electrode may have one portion disposed on the third side surface and the other portion disposed between the first and second substrates, and the common electrode may be connected to the other portion of the side common electrode.

In an embodiment, the side common electrode may be connected to the second and third side surfaces of the side surface and further disposed on a fourth side surface facing the first side surface.

In an embodiment, the display panel may include a plurality of driving lines and a plurality of side electrodes connected to the driving lines and disposed on the second side surface, and the side electrodes may be electrically connected to the first gate driving units.

In an embodiment of the invention, a display device includes: a display panel having a top surface, a bottom surface facing the top surface, and a plurality of side surfaces which connects the top surface to the bottom surface, where the display panel includes a first substrate including a plurality of pixels and on which the bottom surface is defined, and a second substrate disposed opposite to the first substrate and on which the top surface is defined; a plurality of data driving units disposed on a first side surface of the side surfaces; a plurality of gate driving units disposed on the first substrate; a plurality of side electrodes disposed on a second side surface of the side surfaces, which is connected to the first side surface, where the side electrodes are connected to the gate driving units; and a control signal line disposed on the first and second side surfaces to connect a first adjacent data driving unit of the data driving units, which is disposed adjacent to the second side surface, to the side electrodes.

In an embodiment, the display device may further include a connecting pad disposed in the first substrate, where the connecting pad connects the gate driving units to the side electrodes, and each of the side electrodes may have one portion disposed on the second side surface and the other portion disposed between the first and second substrates and is connected to the connecting pad.

In an embodiment, the display device may further include a dummy signal line disposed in the first substrate, where the dummy signal line connects the gate driving units to the first adjacent data driving unit.

In an embodiment, the display device may further include a side common electrode disposed on a third side surface of the side surfaces, which is connected to the first side surface; and a common power line disposed on the first and third side surfaces to connect a second adjacent data driving unit of the data driving units, which is disposed adjacent to the third side surface, to the side common electrode.

In an embodiment, the first substrate further may include a plurality of pixels, the second substrate may include a common electrode, and the side common electrode may be connected to the common electrode.

In an embodiment of the invention, a display device includes: a display panel including a top surface, a bottom surface facing the top surface, and a plurality of side surfaces which connects the top surface to the bottom surface; a data driving unit disposed on a first side surface of the side surfaces; a gate driving unit disposed on a second side surface of the side surfaces, which is connected to the first substrate; and a control signal line disposed on the first and second side surfaces, where the control signal line connects the data driving unit to the gate driving unit.

BRIEF DESCRIPTION OF THE FIGURES

The accompanying drawings are included to provide a further understanding of the invention, and are incorporated in and constitute a part of this specification. The drawings illustrate exemplary embodiments of the invention and, together with the description, serve to explain principles of the invention. In the drawings:

FIG. 8 is a plan view illustrating a control signal line disposed on a side surface of a display panel according to another alternative embodiment of the invention;

DETAILED DESCRIPTION

Figure 1A:
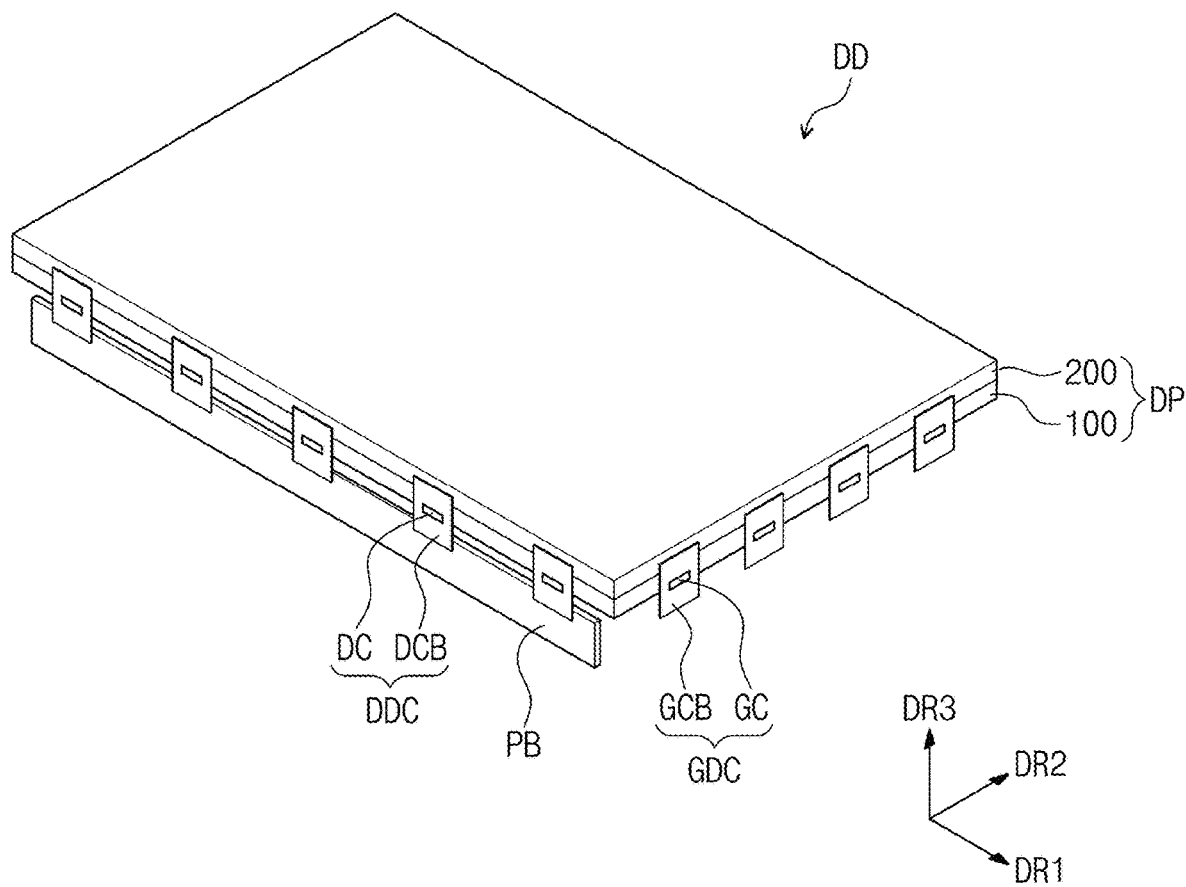
FIG. 1A is a perspective view of a display device according to an embodiment of the invention.

Since the disclosure may have diverse modified embodiments, preferred embodiments are illustrated in the drawings and are described in the detailed description of the invention. However, this does not limit the disclosure within specific embodiments and it should be understood that the disclosure covers all the modifications, equivalents, and replacements within the idea and technical scope of the invention.

Like reference numerals refer to like elements throughout. In the figures, the dimensions of layers and regions are exaggerated for clarity of illustration. It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

It will be understood that when an element is referred to as being "on" another element, it can be directly on the other element or intervening elements may be present therebetween. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/ or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the invention will be described in detail with reference to the accompanying drawings.

Figure 1B:
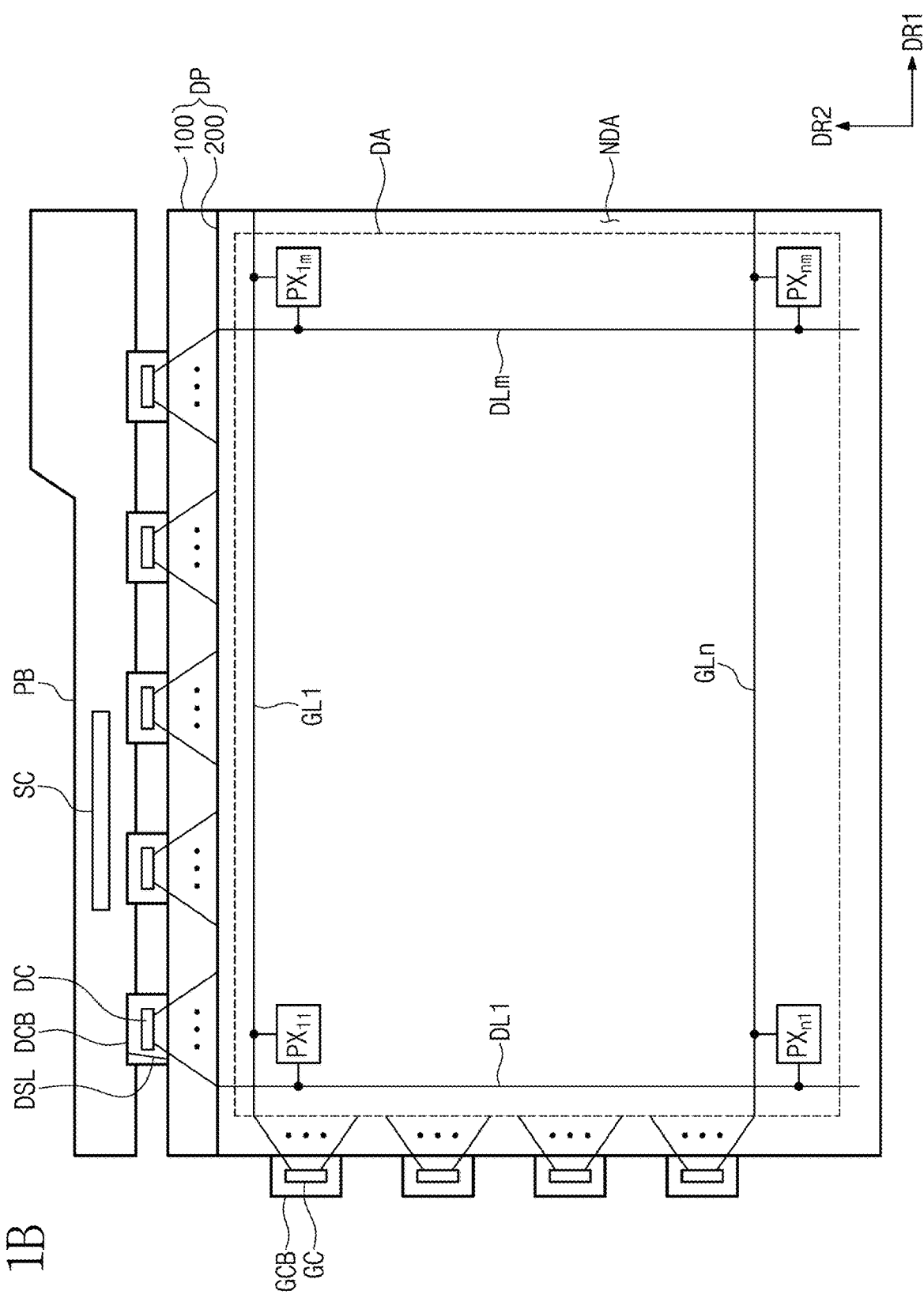
FIG. 1B is a plan view of the display device according to an embodiment of the invention.

FIG. 1A is a perspective view of a display device according to an embodiment of the invention. FIG. 1B is a plan view of the display device according to an embodiment of the invention.

According to an embodiment of the invention, a display device DD may be applied to or included in an electronic device such as a television, a personal computer, a notebook computer, a navigation unit for a vehicle, a game console, an acoustic electronic device, a smart watch, and a camera, for example, but not being limited thereto. Alternatively, other electronic devices may be adaptable when they are not deviated from a concept of the disclosure.

Referring to FIGS. 1A and 1B, an embodiment of the display device DD include a display panel DP, a main circuit board PB, a gate driving unit GDC, a data driving unit DDC, and a signal control unit SC.

According to an embodiment of the invention, the display panel DP may include an organic light emitting display panel, a liquid crystal display panel, a plasma display panel, an electrophoretic display panel, a microelectromechanical system ("MEMS") display panel, or an electrowetting display panel, for example. Hereinafter, for convenience of description, exemplary embodiments where the display panel DP is a liquid crystal display panel will be described in detail. However, an embodiment of the invention is not limited to a specific type of display panel.

In an embodiment, the display panel DP may include a first substrate 100 and a second substrate 200 disposed on the first substrate 100. In such an embodiment, although not shown, a liquid crystal layer may be disposed between the first substrate 100 and the second substrate 200. However, the technical concept of an embodiment of the invention is not limited to a specific configuration of the display panel. In one embodiment, for example, the display panel DP may be an organic electroluminescent display panel, and light emitting unit elements may be disposed on the first substrate 100 instead of the liquid crystal layer disposed between the first substrate 100 and the second substrate 200.

In an embodiment, the display panel DP is parallel to a surface defined by a first direction DR1 and a second direction DR2. A third direction DR3 indicates a direction normal to the display panel DP. The third direction DR3 indicates a thickness direction of the display device DD. Front and rear surfaces of each of members are divided by the third direction DR3. However, directions indicated by the directions DR1, DR2, and DR3 may be a relative concept and change with respect to each other.

In an embodiment, the display panel DP may include the first substrate 100, the second substrate 200 spaced apart from the first substrate 100, and the liquid crystal layer (not shown) disposed between the first substrate 100 and the second substrate 200. When viewed from a plan view, e.g., a top plan view, the display panel DP includes a display area DA in which a plurality of pixels $PX_{11}$ to $PX_{nm}$ are disposed and a non-display area NDA surrounding the display area DA.

In an embodiment, the first substrate 100 includes a plurality of driving lines including a plurality of gate lines GL1 to GLn and a plurality of data lines DL1 to DLm crossing the gate lines GL1 to GLn. In such an embodiment, the first substrate 100 includes a plurality of pixels $PX_{11}$ to $PX_{nm}$ connected to the gate lines GL1 to and data lines DL1 to DLm. The plurality of gate lines GL1 to GLn is connected to the gate driving unit GDC. The plurality of data lines DL1 to DLn are connected to the data driving unit DDC.

For convenience of illustration, only a portion of the plurality of gate lines GL1 to GLn and a portion of the plurality of data lines DL1 to DLm and only a portion of the plurality of pixels $PX_{11}$ to $PX_{nm}$ are illustrated in FIG. 1B. Each of the plurality of pixels $PX_{11}$ to $PX_{nm}$ is connected to the corresponding gate line of the plurality of gate lines GL1 to GLn and the corresponding data line of the plurality of data lines DL1 to DLm.

The plurality of pixels $PX_{11}$ to $PX_{nm}$ may be divided in a plurality of groups according to a display color thereof. Each of the plurality of pixels $PX_{11}$ to $PX_{nm}$ may display one of primary colors. The primary colors may include red, green, blue, and white colors. However, the embodiment of the invention is not limited thereto. Alternatively, the primary colors may further include other various colors such as yellow, cyan, and magenta colors, for example.

As illustrated in FIG. 1B, the signal control unit SC may be disposed or mounted on the main circuit board PB. The signal control unit SC receives an image data and a control signal from a graphic control unit (not shown). The control signal may include a vertical synchronization signal for distinguishing frame intervals Fn−1, Fn, and Fn+1, a horizontal synchronization signal for distinguishing horizontal intervals HP, i.e., a row distinguishing signal, an enable signal that is at a high level only during an interval in which data is outputted to display an area to which the data is entered, and clock signals. However, the embodiment of the invention is not limited to the above-described types of control signal. In one embodiment, for example, the control signal may include a plurality of signals for driving the gate driving unit GDC and the data driving unit DDC.

The signal control unit SC generates a gate control signal for controlling the gate driving unit GDC in response to the control signal to transmit the generated gate control signal to the gate driving unit GDC. The signal control unit SC generates a data control signal for controlling the data driving unit DDC to transmit the generated data control signal to the data driving unit DDC.

The gate driving unit GDC is provided in plurality and generates gate signals based on the gate control signal within the frame intervals Fn−1, Fn, and Fn+1. The gate driving unit GDC outputs the gate signals to gate lines. The gate signals may be sequentially outputted in response to the horizontal intervals.

In an embodiment, the gate driving unit GDC may be provide in plurality, but the embodiment of the invention is not limited thereto. Alternatively, the gate driving unit GDC may be provided as a single gate driving unit to generate the gate signals. In one embodiment, for example, the display device DD including the single gate driving unit may be applied to a mobile phone.

The gate driving unit GDC may include a gate driving chip GC and a gate circuit board GCB on which the gate driving chip GC is disposed or mounted. In one embodiment, for example, the gate circuit board GCB may be provided as a flexible printed circuit, but the embodiment of the invention is not limited thereto. The gate driving unit GDC may be provided in plurality and arranged in the second direction DR2.

According to an embodiment of the invention, the gate circuit board GCB may be disposed on a side surface of side surfaces of the display panel DP. Herein, the side surfaces of the display panel DP may be defined as surfaces thereof parallel to the third direction DR3 or the thickness direction thereof. The gate circuit board GCB is electrically connected to the gate lines GL1 to GLn and transmits the gate signals outputted from the gate driving chip GC to the gate lines GL1 to GLn.

According to an embodiment of the invention, the gate driving unit GDC and the data driving unit DDC may be provided in a form of a tape carrier package ("TCP").

In an embodiment, one end of the gate circuit board may be disposed on the non-display area NDA of the display panel DP. In such an embodiment, the typical non-display area NDA includes an area on which one end of the gate circuit board is disposed.

In such an embodiment, where the gate circuit board GCB is disposed on a side surface of the side surfaces of the display panel DP, the non-display area NDA of the display panel DP may be reduced. In such an embodiment, as the one end of the gate circuit board GCB is not disposed on the non-display area NDA of the display panel DP, the non-display area NDA may be reduced as much as the area conventionally occupied by the one end of the typical gate circuit board. Thus, the display area DA of the display panel DP according to an embodiment of the invention may be effectively increased.

In an embodiment, the display area DA and the non-display area NDA may be defined on a top surface or a bottom surface, on which an image is substantially displayed, instead of the side portion of the display panel DP. Accordingly, in the display panel having a same size, when the non-display area NDA is reduced, the display area DA for displaying an image may be increased.

Conventionally, a control signal line for electrically connecting the data driving unit to the gate driving unit and transmitting the gate control signal outputted from the signal control unit SC to the gate driving unit GDC is disposed on the non-display area NDA defined on a top surface or a bottom surface of the display panel DP.

In an embodiment of the invention, the control signal line may be disposed on a side surface of the display panel DP as the gate driving unit GDC. As a result, the non-display area NDA may be reduced as much as an area conventionally occupied by the control line. Thus, the display area DA of the display panel DP according to an embodiment of the invention may be increased.

The above-described structure in which the gate circuit board GCB and the control signal line are disposed on a side surface of the display panel DP will be described in greater detail with reference to FIG. 2A.

The data driving unit DDC is provided in plurality to generate gradation voltages corresponding to the image data provided from the signal control unit SC based on the data control signal received from the signal control unit SC. The data driving unit DDC outputs the gradation voltages to the plurality of data lines DL1 to DLm as data signals.

In an embodiment, the data driving unit DDC may be provided in plurality, but the embodiment of the invention is not limited to the number of the data driving unit DDC. Alternatively, the data driving unit DDC may be provided as a single data driving unit to generate the gradation voltages. In one embodiment, for example, the display device DD including the single data driving unit may be applied to, e.g., a mobile phone.

The data driving unit DDC may include a data driving chip DC and a data circuit board DCB on which the data driving chip DC is disposed or mounted. According to an embodiment, the data circuit board DCB may be provided as a flexible printed circuit. The data circuit board DCB electrically connects the main circuit board PB to the first substrate 100. The plurality of driving chips DC provide the data signals to the corresponding data lines of the plurality of data lines DL1 to DLm.

According to an embodiment of the invention, the data circuit board DCB may be disposed on another side surface of the side surfaces of the display panel DP. In such an embodiment, as one end of the data circuit board DCB is not disposed on the non-display area NDA of the display panel DP, the non-display area NDA may be reduced as much as an area conventionally occupied by one end of the typical data circuit board. Thus, the display area DA of the display panel DP according to an embodiment of the invention may be increased.

According to an embodiment of the invention, the gate control signal outputted from the signal control unit SC may be provided to the gate circuit board GCB through the data circuit board DCB. In such an embodiment, a dummy line DSL for transmitting the gate signal outputted from the signal control unit SC to the gate circuit board GCB may be disposed on the data circuit board DCB. In such an embodiment, the data circuit board, on which the dummy line DSL is disposed, may be the most adjacent data circuit board to the gate circuit board among the plurality of data driving units.

Figure 2A:
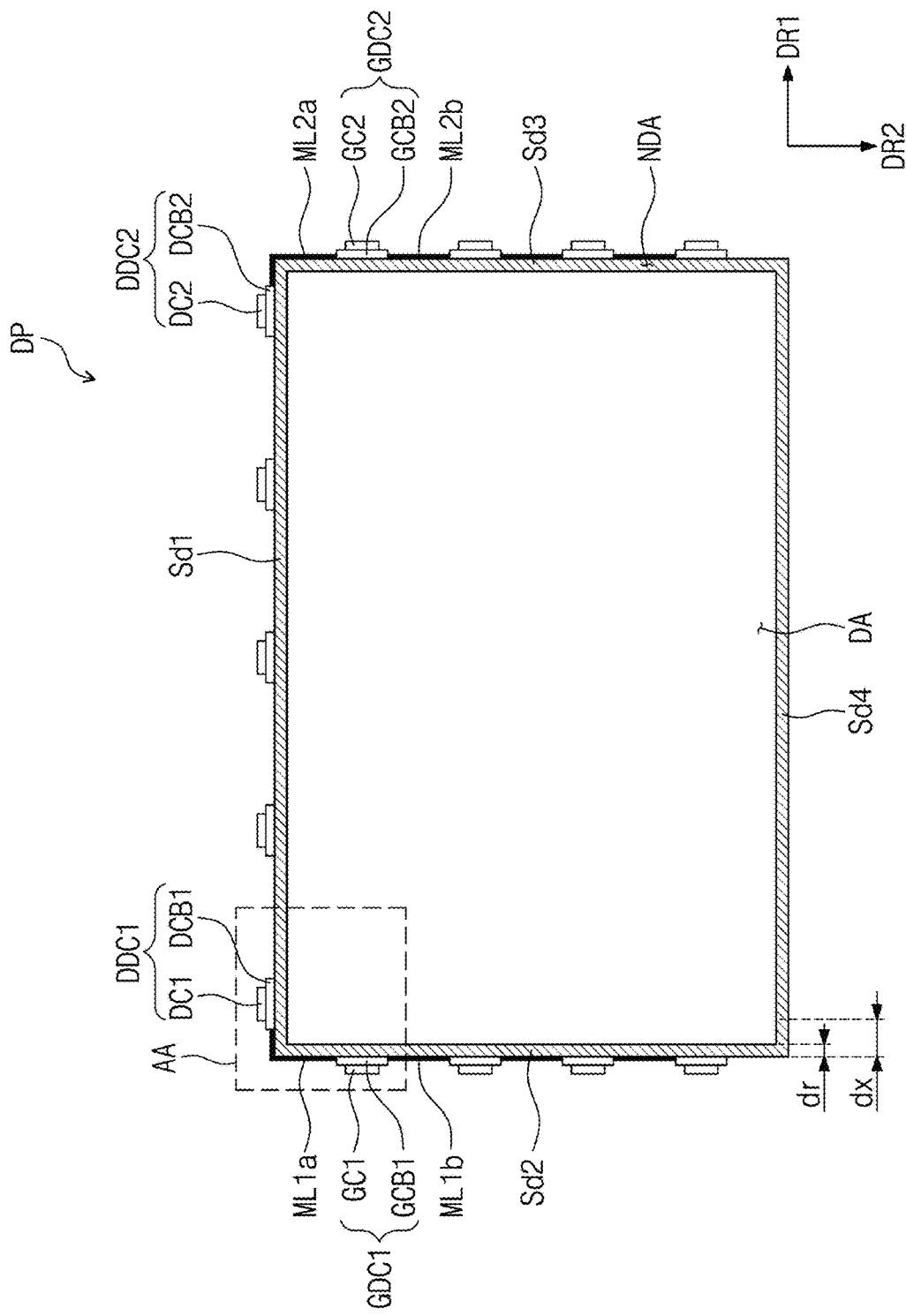
FIG. 2A is a plan view of a display panel according to an embodiment of the invention.
Figure 2B:
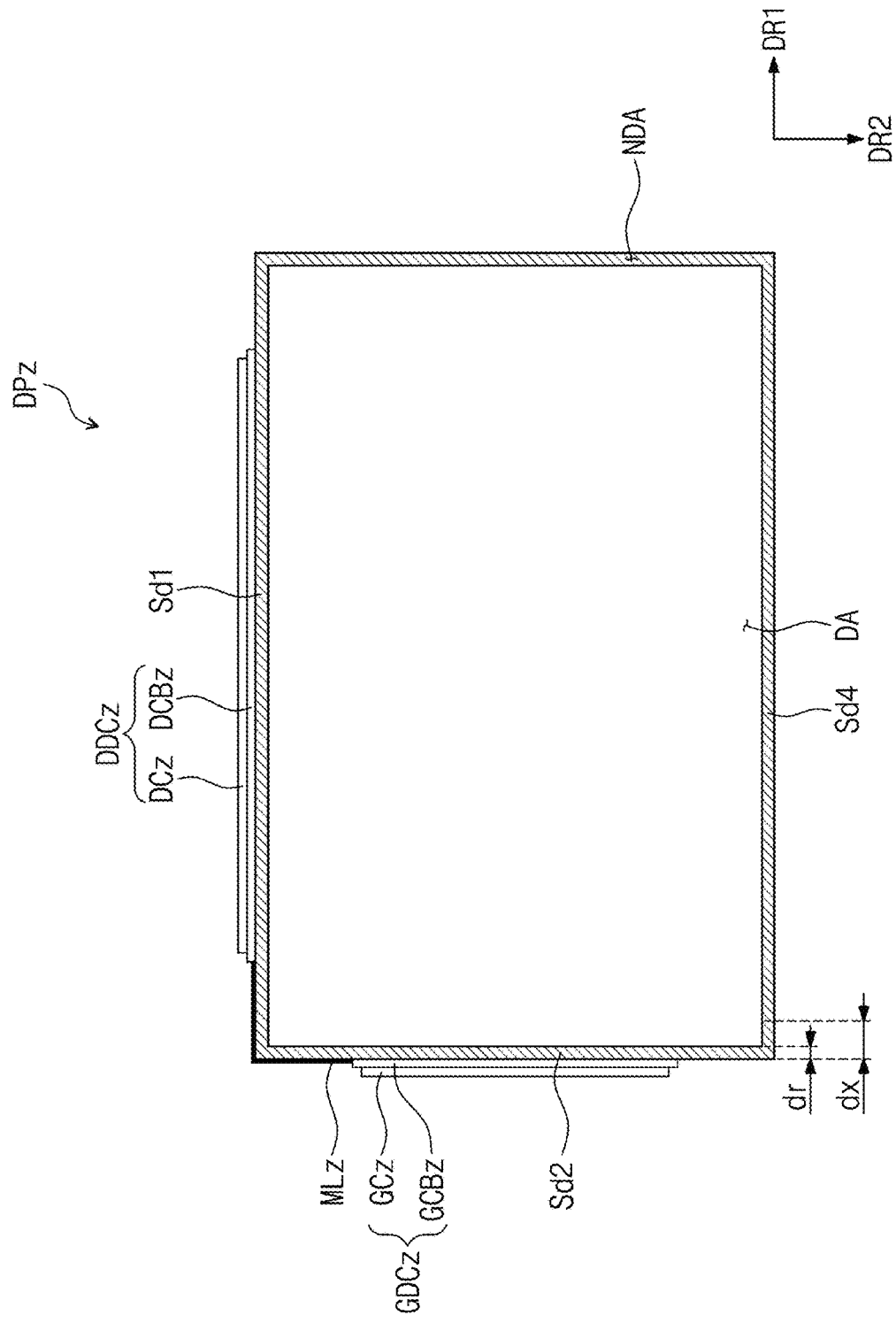
FIG. 2B is a plan view of a display panel according to an alternative embodiment of the invention.
Figure 3A:
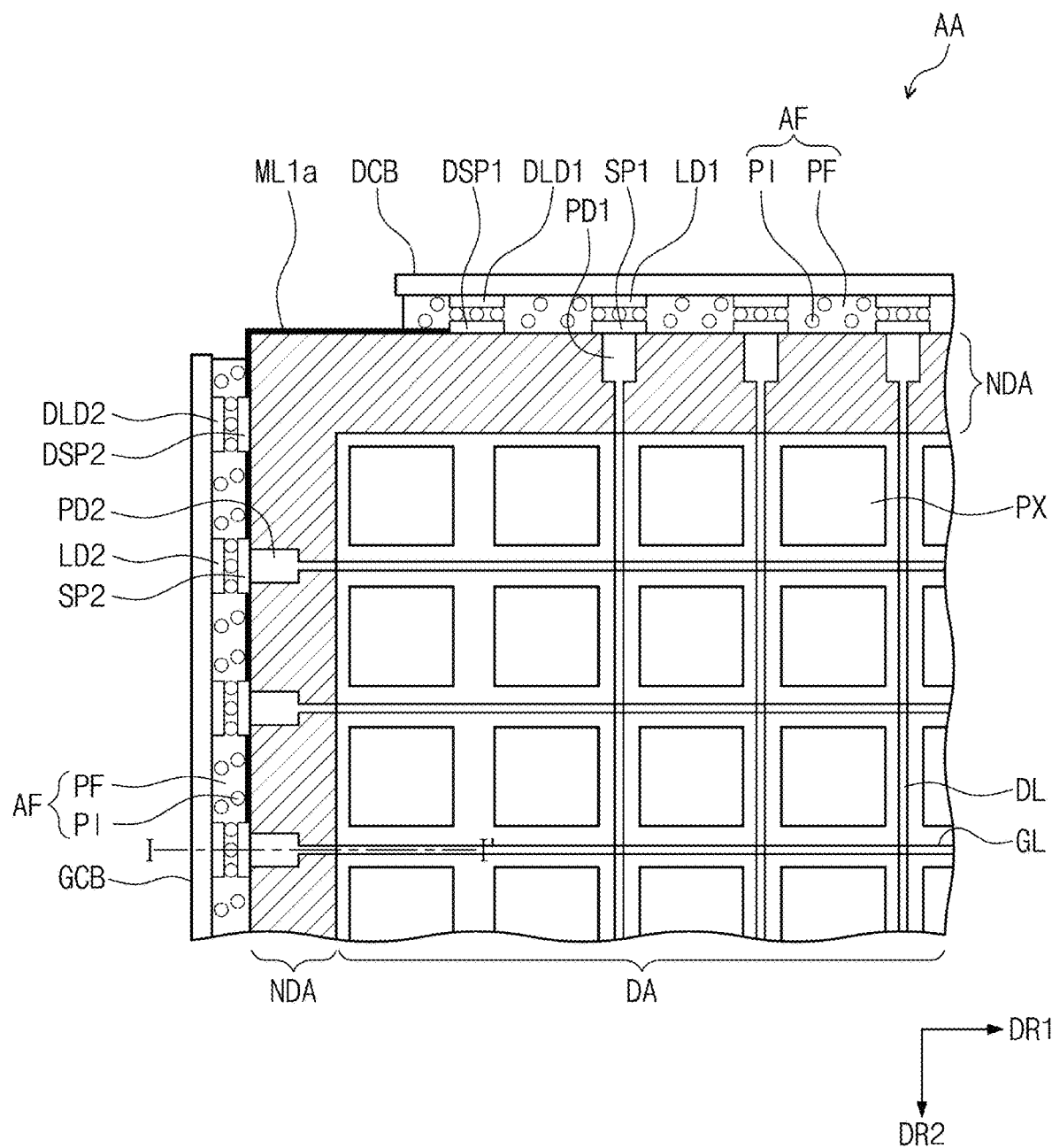
FIG. 3A is a partial enlarged view illustrating a portion AA of FIG. 2A.
Figure 3B:
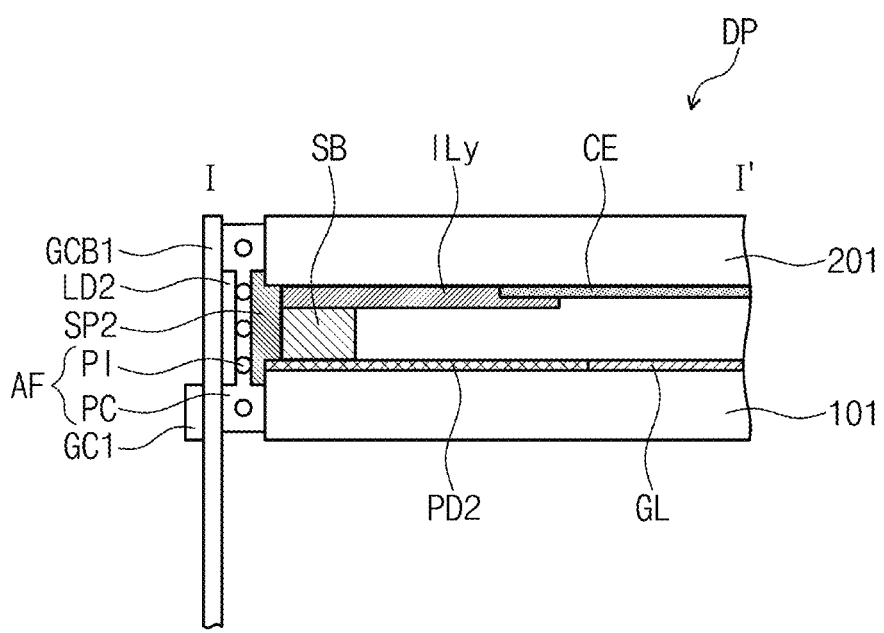
FIG. 3B is a cross-sectional view taken along line I-I' of FIG. 3A.

FIG. 2A is a plan view of a display device according to an embodiment of the invention. FIG. 2B is a plan view of a display device according to an alternative embodiment of the invention. FIG. 3A is a partial enlarged view illustrating a portion AA of FIG. 2A. FIG. 3B is a cross-sectional view taken along line I-I' of FIG. 3A.

Referring to FIG. 2A, in an embodiment, the display panel DP may include a first side surface Sd1, a second side surface Sd2, a third side surface Sd3, and a fourth side surface Sd4. The first side surface Sd1 and the fourth side surface Sd4 may be spaced apart from each other to face each other in the second direction DR2. Each of the second side surface Sd2 and the third side surface Sd3 may be connected to each of the first side surface Sd1 and the fourth side surface Sd4. The second side surface Sd2 and the third side surface Sd3 may be spaced apart from each other to face each other in the first direction DR1.

In such an embodiment of the display panel DP, a plurality of gate driving units (referred to as GDC in FIG. 1A) may be disposed on each of the second side surface Sd2 and the third side surface Sd3. Hereinafter, the gate driving units disposed on the second side surface Sd2 will be described as first gate driving units, and the gate driving units disposed on the third side surface Sd3 will be described as second gate driving units.

Each of the first gate driving units and the second gate driving units may transmit the gate signals to the gate lines GL1 to GLn. However, the embodiment of the invention is not limited to the position of the gate driving units as described above. In one alternative embodiment, for example, the gate driving units may be disposed on a single side surface, e.g., only one side surface of the second side surface Sd2 and the third side surface Sd3.

In an embodiment, as shown in FIG. 2A, the first gate driving units may be disposed on the second side surface Sd2 and arranged in the second direction DR2. In such an embodiment, the second gate driving units may be disposed on the third side surface Sd3 and arranged in the second direction DR2. The data driving units (referred to as DDC in FIG. 1A) may be disposed on the first side surface Sd1 and arranged in the first direction DR1.

According to an embodiment of the invention, the data driving units may be electrically connected to the first and second gate driving units through the control signal line. In such an embodiment, the control signal line includes a first control signal line for connecting the first gate driving units to one data driving unit of the data driving units. In such an embodiment, the control signal line includes a second control signal line for connecting the second gate driving units to one data driving unit of the data driving units.

Herein, the data driving unit disposed the most adjacent to the second side surface Sd2 among the data driving units will be referred to as a first adjacent data driving unit DDC1. The data driving unit disposed the most adjacent to the third side surface Sd3 among the data driving units will be referred to as a second adjacent data driving unit DDC2. The gate driving unit disposed the most adjacent to the first side surface Sd1 among the first gate driving units will be referred to as an adjacent first gate driving unit GDC1. The gate driving unit disposed the most adjacent to the first side surface Sd1 among the second gate driving units will be referred to as an adjacent second gate driving unit GDC2.

In an embodiment, the first control signal line includes a first sub-control signal line ML1a and a plurality of second sub-control signal lines ML1b. The first sub-control signal line ML1a is disposed on the first side surface Sd1 and the second side surface Sd2 to connect the adjacent first gate driving unit GDC1 to the first adjacent data driving unit DDC1. The first sub-control signal line ML1a has one end connected to a first data circuit board DCB1 of the first adjacent data driving unit DDC1 and the other end connected to a first gate circuit board GCB1 of the adjacent first gate driving unit GDC1.

Accordingly, in such an embodiment, the gate control signal may be transmitted from the first data circuit board DCB1 to the first gate circuit board GCB1 through the first sub-control signal line ML1a. As a result, the gate control signal transmitted to the first gate circuit board GCB1 may be transmitted to the first gate driving chip GC1.

The second sub-control signal lines ML1b are disposed on the second side surface Sd2 to connect the first gate driving units connected to the second side surface Sd2 to each other. In such an embodiment, each of the second sub-control signal lines ML1b connects two gate driving units disposed adjacent to each other among the first gate driving units.

In an alternative embodiment, referring to FIG. 2B, a display device DDz is applied to a mobile phone. In such an embodiment, the display device DDz may include a single gate driving unit GDCx and a single data driving unit DDCz. The gate driving unit GDCz includes a single gate driving chip GCz and a single gate circuit board GCBz. The data driving unit DDCz includes a single data driving chip DCz and a single data circuit board DCBz.

In such an embodiment, a control signal line MLz may be disposed on the first side surface Sd1 and the second side surface Sd2 to connect the gate circuit board GCBz to the data circuit board DCBz.

In an embodiment, the display device DDz includes the single gate driving unit GDCz and the single data driving unit DDCz as illustrated in FIG. 2B, but the concept of the embodiment of the invention is not limited to the configuration of the display device. In one alternative embodiment, for example, the display device DDz may include the single gate driving unit GDCz and a plurality of data driving units. In another alternative embodiment, the display device DDz may include the single data driving unit DDCz and a plurality of gate driving units, for example.

Referring back to FIG. 2A, in an embodiment, the second control signal line includes a third sub-control signal line ML2a and a plurality of fourth sub-control signal lines ML2b. The third sub-control signal line ML2a connects the adjacent second gate driving unit GDC2 to the second adjacent data driving unit DDC2. The third sub-control signal line ML2a has one end connected to a second data circuit board DCB2 of the second adjacent data driving unit DDC2 and the other end connected to a second gate circuit board GCB2 of the adjacent second gate driving unit GDC2. Accordingly, in such an embodiment, the gate control signal may be transmitted from the second data circuit board DCB2 to the second gate circuit board GCB2 through the third sub-control signal line ML2a. As a result, the gate control signal transmitted to the second gate circuit board GCB2 may be transmitted to the second gate driving chip GC2.

The fourth sub-control signal lines ML2b connect the second gate driving units connected to the third side surface Sd3 to each other. In such an embodiment, each of the fourth sub-control signal lines ML2b connects two gate driving units disposed adjacent to each other among the second gate driving units to each other.

In a conventional display panel, as illustrated in FIG. 2A as the gate driving unit is disposed on the non-display area NDA defined on a front surface of the display panel DP, the non-display area NDA typically extends from the second side surface Sd2 to have a length of a first length dx in the first direction DR1.

In an embodiment, the non-display area NDA may extend from the second side surface Sd2 to have a length of a second length dr in the first direction DR1, which is less than the first length dx. In such an embodiment, as the length is shortened from first length dx to the second length dr, the non-display area may be reduced as much as the shortened length.

Referring to FIG. 3A, the display panel DP includes a data pad PD1 extending from the data line DL and a gate pad PD2 extending from the gate line GL. The data pad PD1 may be provided in plurality to correspond to the number of the data lines DL, and the gate pad PD2 may be provided in plurality to correspond to the number of the gate lines GL. The data pad PD1 and the gate pad PD2 are disposed on the non-display area NDA.

The gate pad PD2 extends from one end or the other end of the gate line GL and disposed adjacent to the second side surface Sd2. In one embodiment, for example, the gate line GL may have one end connected to the gate pad PD2 disposed adjacent to the second side surface Sd2 and the other end connected to the gate pad PD2 disposed adjacent to the third side surface Sd3.

In an embodiment, although not shown, the gate pads PD2 may extend from the gate lines in different manners from each other. In one embodiment, for example, the gate pad PD2 disposed adjacent to the second side surface Sd2 extends from one end of an odd-numbered gate line, and the gate pad PD2 disposed adjacent to the third side surface Sd3 may extend from the other end of the even-numbered gate line.

In an embodiment, the display panel DP further includes a first side electrode SP1 and a first dummy side electrode DSP1. The first side electrode SP1 is provided in plurality to be disposed on the first side surface Sd1, and directly connected to a corresponding data pad PD1. The first dummy side electrode DSP1 may be disposed the most adjacent to the second side surface Sd2 on the first side surface Sd1. The display panel DP may further include a first dummy side electrode DSP1 disposed the most adjacent to the third side surface Sd3 on the first side surface Sd1.

The display panel DP includes a second side electrode SP2 and a second dummy side electrode DSP2. The second side electrode SP2 is provided in plurality to be disposed on the second side surface Sd2, and directly connected to a corresponding gate pad PD2. The second dummy side electrode DSP2 may be disposed the most adjacent to the first side surface Sd1 on the second side surface Sd2. The second dummy side electrode DSP2 is connected to the first dummy side electrode DSP1 through the first sub-control signal line ML1a.

Although not shown, the display panel DP includes a third side electrode and a third dummy side electrode. The third side electrode is provided in plurality to be disposed on the third side surface Sd3, and directly connected to a corresponding gate pad. The third dummy side electrode may be disposed the most adjacent to the first side surface Sd1 on the third side surface Sd3.

In an embodiment, one first dummy side electrode DSP1 is provided, but the embodiment of the invention is not limited thereto. Alternatively, the first dummy side electrode DSP1 may be provided in plurality. In such an embodiment, the number of the first dummy side electrode DSP1 may be determined to correspond to the number of the first sub-control signal line ML1a. In one embodiment, for example, when five control signals are outputted from the signal control unit SC (refer to FIG. 1A), five first sub-control signal lines ML1a and five first dummy side electrode DSP1 may be provided. In an embodiment, as described above, a single second dummy side electrode DSP2 is provided, but the embodiment of the invention is not limited thereto. In such an embodiment, the number of the second dummy side electrode DSP1 may be determined to correspond to the number of the first sub-control signal line ML1a.

According to an embodiment of the invention, each of the first and second side electrodes SP1 and SP2 may include a metal material including or made of silver (Ag) or carbon (C).

According to an embodiment of the invention, a method for respectively providing the first and second side electrodes SP1 and SP2 on the first and second side surfaces Sd1 and Sd2 of the display panel DP may include a method for depositing a metal material and then forming an electrode by using laser, or a silk screen method.

The data circuit board DCB of each of the data driving units may include a first base film (not shown), and each of the data driving units includes a first line electrode LD1 disposed on the data circuit board DCB. In such an embodiment, at least one data driving unit of the data driving units further includes a first dummy line electrode DLD1. The above-described one data driving unit may be connected to the first sub-control signal line ML1a.

The first base film may include or be made of a flexible material such as polyimide, for example. The first line electrode LD1 may be provided in plurality to be disposed on the first base film. The first line electrode LD1 may be connected to the data driving chip DC to receive the data signal outputted from the data driving chip DC. The first line electrode LD1 may transmit the received data signal to the first side electrode SP1 through an anisotropic conductive film AF. The anisotropic conductive film AF includes conductive particles PI disposed or dispersed in an adhesion film PF having adhesiveness. The conductive particles PI electrically connect the line electrode to the side electrode.

The first dummy line electrode DLD1 may be electrically connected to the first dummy side electrode DSP1 through the anisotropic conductive film AF. The first dummy line electrode DLD1 may be connected to the dummy line DSL shown in FIG. 1B. In such an embodiment, the gate control signal outputted from the signal control unit SC (refer to FIG. 1A) may be transmitted to the first dummy line electrode DLD1 through the dummy line DSL. The gate control signal transmitted to the first dummy line electrode DLD1 may be provided to the second dummy side electrode DSP2 through the first sub-control signal line ML1a.

The gate circuit board GCB of each of the gate driving units may include a second base film (not shown), and each of the gate driving units includes a second line electrode LD2 disposed on the gate circuit board GCB. In such an embodiment, at least one gate driving unit of the gate driving units further includes a second dummy line electrode DLD2. The above-described one gate driving unit may be connected to the first sub-control signal line ML1a.

The second base film may include or be made of a flexible material such as polyimide, for example. The second line electrode LD2 may be provided in plurality to be disposed on the second base film. The second line electrode LD2 may be connected to the gate driving chip GC to receive the gate signal outputted from the gate driving chip GC. The second line electrode LD2 may transmit the received gate signal to the second side electrode SP2 through the anisotropic conductive film AF.

The second dummy line electrode DLD2 may be electrically connected to the second dummy side electrode DSP2 through the anisotropic conductive film AF. In such an embodiment, the gate control signal provided to the second dummy side electrode DSP2 may be transmitted to the second dummy line electrode DLD2 through the anisotropic conductive film AF. As a result, the gate control signal may be transmitted to the gate driving chip GC connected to the second dummy line electrode DLD2.

In an embodiment, the first and second dummy line electrodes DLD1 and DLD2 and the first and second line electrode LD1 and LD2 may include or be made of a metal material such as copper (Cu), silver (Ag), gold (Au), or aluminum (Al).

Referring to FIG. 3B, the gate pad PD2 may be disposed in a first substrate 101 of the first substrate 100. The gate pad PD2 may be directly connected to the gate line GL and the second side electrode SP2. In an embodiment, although not shown, the data pad PD1 may be disposed in the first base substrate 101 together with the gate pad PD2. In such an embodiment, the data pad PD1 and the gate pad PD2 may be disposed in or directly on a same layer as the gate lines GL1 to GLn and the data lines DL1 to DLm.

In an embodiment, a common electrode CE may be disposed in a second base substrate 201 of the second substrate 200. In such an embodiment, an insulation layer ILy covering a portion of the common electrode CE may be disposed on the second base substrate 201. The insulation layer ILy insulates the second side electrode SP2 from the common electrode CE.

In an embodiment, although not shown, a light shielding material such as black matrix may be disposed on the non-display area NDA of the second substrate 200 such that light is effectively prevented from being emitted to the outside.

A liquid crystal layer and an adhesion member SB for preventing the liquid crystal layer from being lost to the outside may be disposed between the first substrate 100 and the second substrate 200. The adhesion member SB may be disposed along an edge of the display panel DP between the first substrate 100 and the second substrate 200. In an embodiment, the adhesion member SB may be disposed to contact the gate pad PD2 and the insulation layer ILy to support the second side electrode SP2.

According to an embodiment of the invention, a method for providing the first and second side electrodes SP1 and SP2 on the first and second side surfaces Sd1 and Sd2 of the display panel DP may include various methods such as a method for depositing a metal material and then forming an electrode by using laser or a silk screen method.

In an embodiment, although not shown, a dam may be disposed between two side electrodes disposed adjacent to each other among the second side electrodes SP2. The dam may be disposed between the first substrate 100 and the second substrate 200. The dam may have at least one of various structures, which may be varied modified based on a shape of the side electrode, and the side electrodes may be supported by the dam.

Figure 4A:
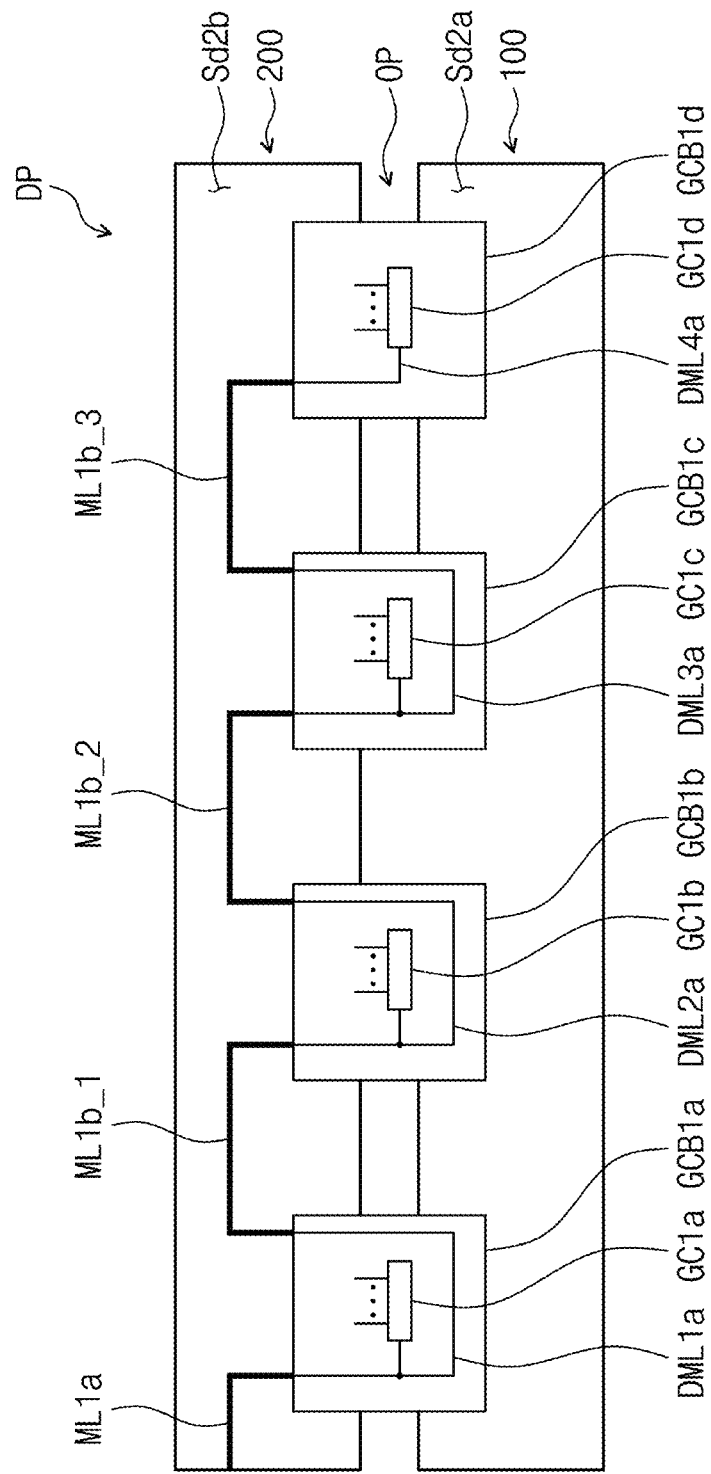
FIG. 4A is a plan view illustrating a control signal line disposed on a side surface of a display panel according to an embodiment of the invention.
Figure 4B:
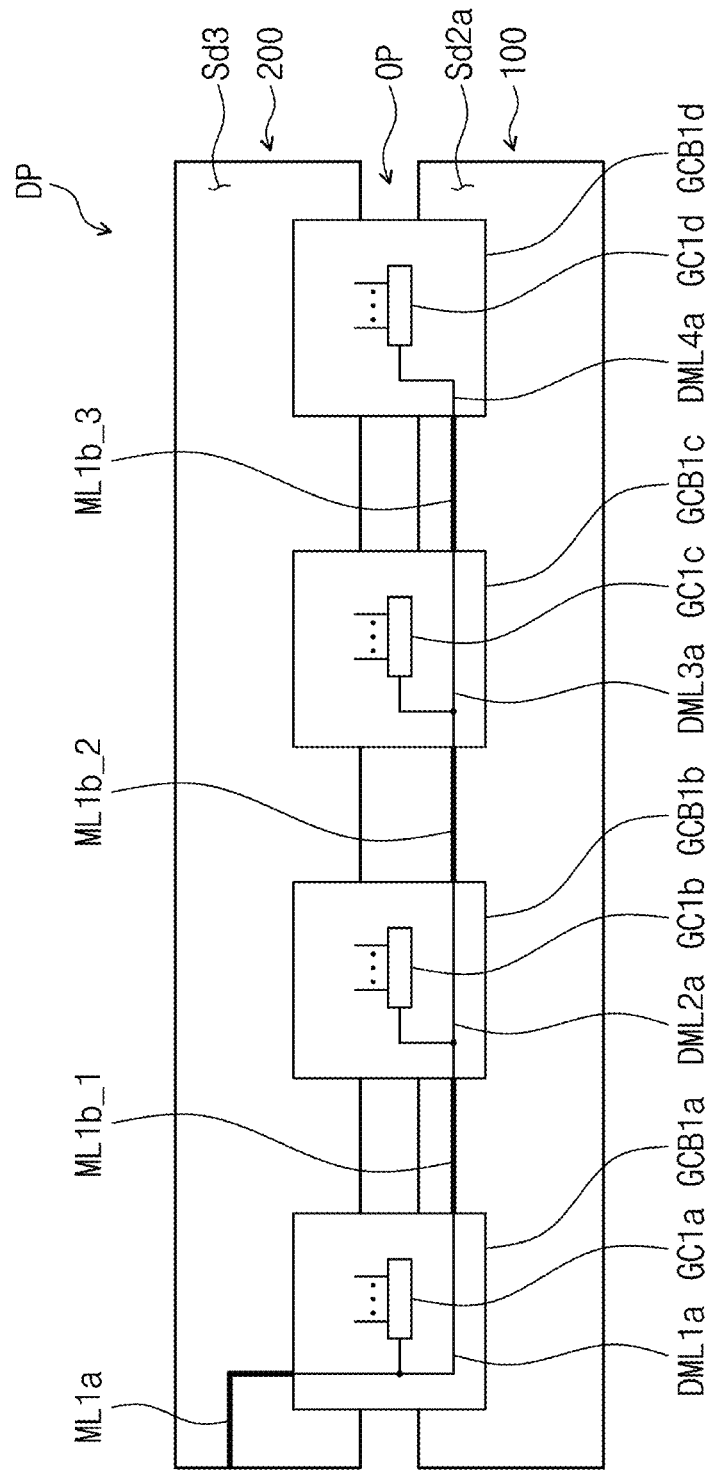
FIG. 4B is a plan view illustrating a control signal line disposed on a side surface of a display panel according to an alternative embodiment of the invention.

FIG. 4A is a plan view illustrating a control signal line disposed on a side surface of a display panel according to an embodiment of the invention. FIG. 4B is a plan view illustrating a control signal line disposed on a side surface of a display panel according to an alternative embodiment of the invention.

Referring to FIG. 4A, the first gate driving units disposed on the second side surface Sd2 of the display panel DP according to an embodiment are illustrated. Each of the first gate driving units has an end portion disposed on a first sub-side surface Sd2a of the second side surface Sd2, which corresponds to the first substrate 100. Each of the first gate driving units has an opposing end portion disposed on a second sub-side surface Sd2b of the second side surface Sd2, which corresponds to the second substrate 200.

In an embodiment, although not shown, a gap OP between the first gate driving units may be filled by the dam. The dam filling the gap between the first driving units may have a structure that may be variously modified.

In an embodiment, first to fourth gate circuit boards GCB1a to GCB1d are disposed on the first sub-side surface Sd2a and the second sub-side surface Sd2b. The first to fourth gate driving chips GC1a to GC1d may be disposed or mounted on the first to fourth gate circuit boards GCB1a to GCB1d, respectively. In such an embodiment, dummy signal lines DML1a to DML4a connected to the first sub-control signal line ML1a and the second sub-control signal lines ML1b_1 to ML1d_4 are disposed on the first to fourth gate circuit boards GCB1a to GCB1d, respectively.

The second sub-control signal line ML1b_1 is disposed on the first sub-side surface Sd2a to connect the first dummy signal line DML1a to the second dummy signal line DML2a. The second sub-control signal line ML1b_2 is disposed on the first sub-side surface Sd2a to connect the second dummy signal line DML2a to the third dummy signal line DML3a. The second sub-control signal line ML1b_3 is disposed on the first sub-side surface Sd2a to connect the third dummy signal line DML3a to the fourth dummy signal line DML4a.

According to an embodiment of the invention, the first sub-control signal line ML1a and the second sub-control signal lines ML1b_1 to ML1b_3 may be disposed on only one sub-side surface of the first sub-side surface Sd2a and the second sub-side surface Sd2b. In such an embodiment, one end and the other end of each of the dummy signal lines DML1a to DML4a may overlap the only one sub-side surface of the first sub-side surface Sd2a and the second sub-side surface Sd2b when viewed from a side view.

In an embodiment, as shown in FIG. 4A, the first sub-control signal line ML1a and the second sub-control signal lines ML1b_1 to ML1b_3 are disposed on the first sub-side surface Sd2a, but the embodiment of the invention is not limited thereto. In one alternative embodiment, for example, the first sub-control signal line ML1a and the second sub-control signal lines ML1b_1 to ML1b_3 may be disposed on the second sub-side surface Sd2b. In such an embodiment, one end and the other end of each of the dummy signal lines DML1a to DML4a may overlap only the second sub-side surface Sd2b when viewed from a side view.

Referring to FIG. 4B, according to an alternative embodiment of the invention, the first sub-control signal line ML1a may be disposed on the first sub-side surface Sd2a, and the second sub-control signal lines ML1b_1 to ML1b_3 may be disposed on the second sub-side surface Sd2b. Alternatively, the first sub-control signal line ML1a may be disposed on the second sub-side surface Sd2b, and the second sub-control signal lines ML1b_1 to ML1b_3 may be disposed on the first sub-side surface Sd2a.

Figure 5A:
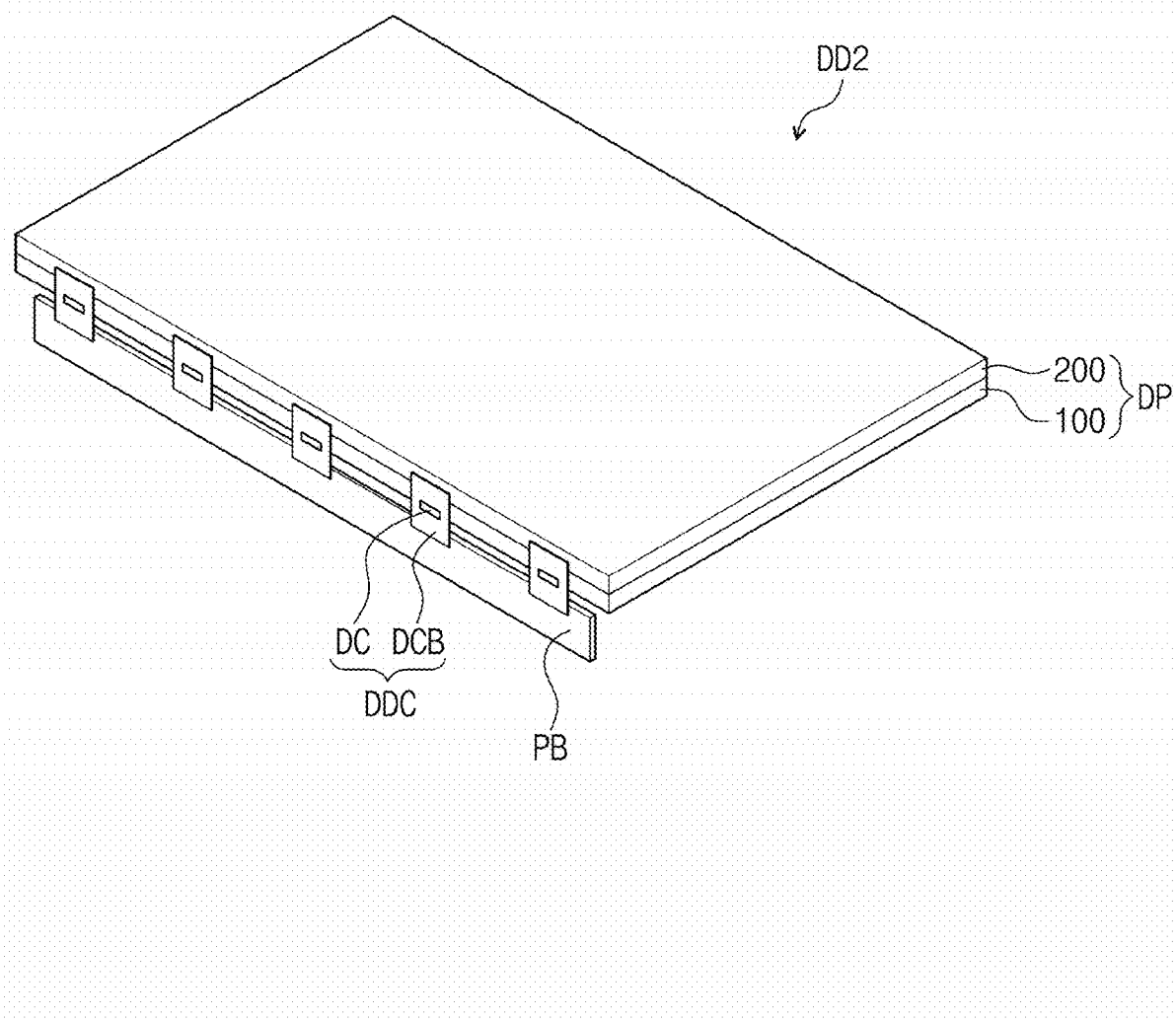
FIG. 5A is a perspective view of a display device according to an embodiment of the invention.
Figure 5B:
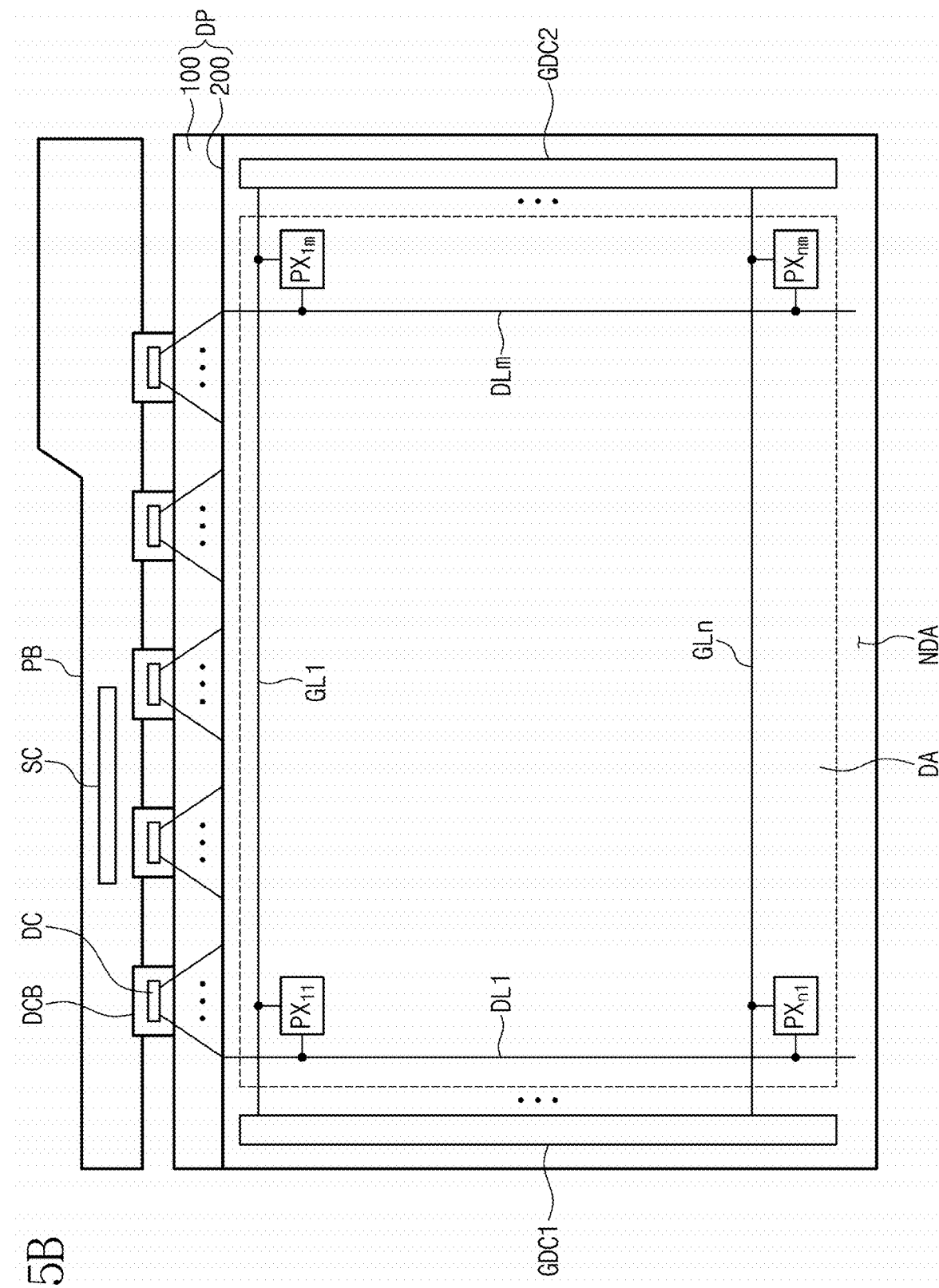
FIG. 5B is a plan view of the display device according to an alternative embodiment of the invention.

FIG. 5A is a perspective view of a display device according to an alternative embodiment of the invention. FIG. 5B is a plan view of the display device according to an alternative embodiment of the invention.

A display device DD2 in FIG. 5A may have substantially the same as the display device DD in FIG. 1A except for the structure of the gate driving unit and the control signal line. The same or like elements shown in FIG. 5A have been labeled with the same reference characters as used above to describe the embodiments of display device described above with reference to FIG. 1A, and any repetitive detailed description thereof will hereinafter be omitted or simplified.

Referring to FIGS. 5A and 5B, the display device DD2 according to an embodiment of the invention may include the gate driving units GDC1 and GDC2 disposed on the first substrate 100 instead of the side surface of the display panel DP. Although FIG. 5B shows an embodiment where two gate driving units GDC1 and GDC2 are provided, the embodiment of the invention is not limited thereto. In an alternative embodiment, only one gate driving unit of the gate driving units GDC1 and GDC2 may be disposed on the first substrate 100.

In an embodiment, the gate driving units GDC1 and GDC2 may be provided on the first substrate 100 together with the pixels $PX_{11}$ to $PX_{nm}$, e.g., at the same time, through a same thin film process. In one embodiment, for example, the gate driving units GDC1 and GDC2 may be disposed or mounted on the non-display area NDA in a type of amorphous silicon thin film transistor ("TFT") gate driver circuit ("ASG") or oxide semiconductor TFT gate driver circuit ("OSG").

Figure 6:
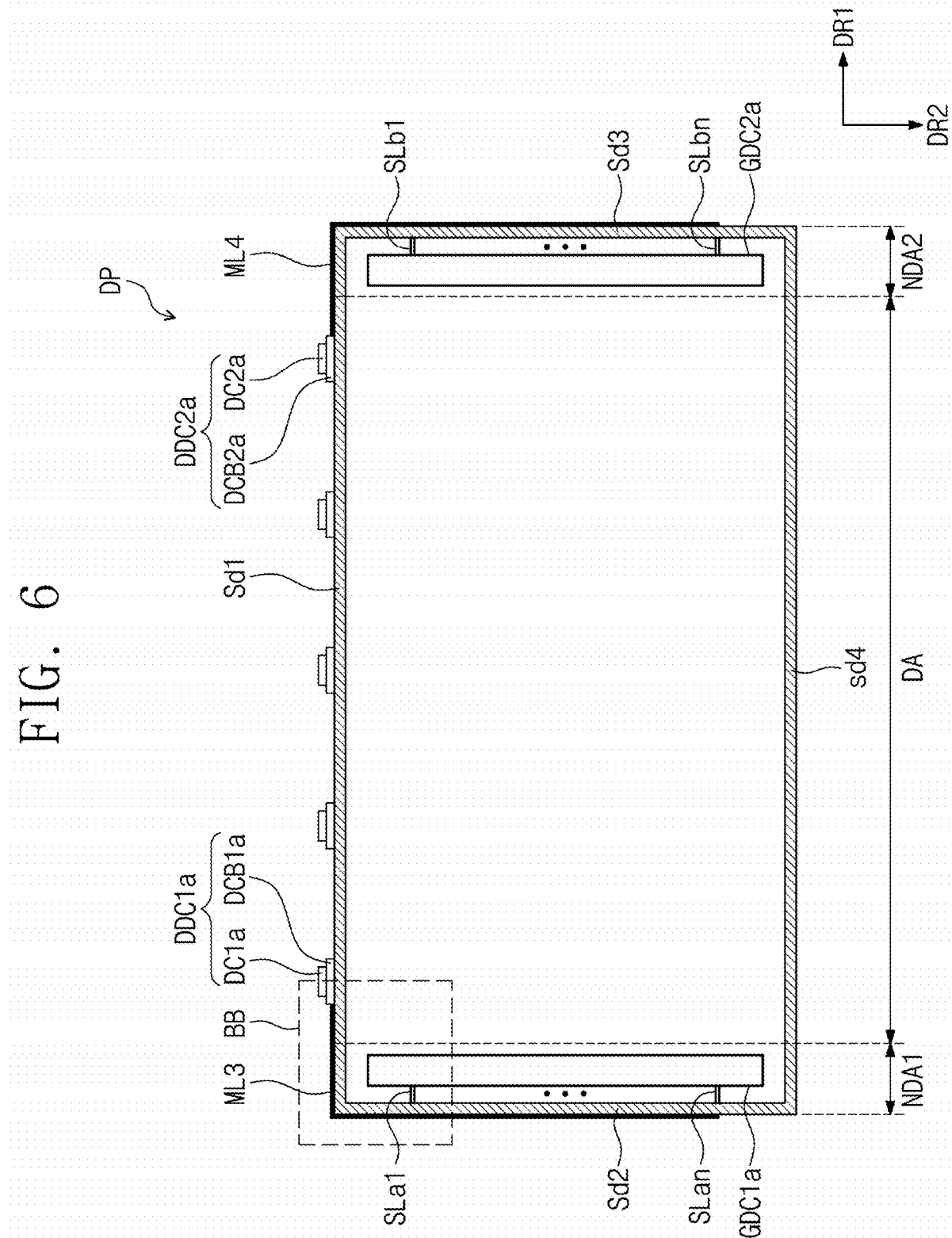
FIG. 6 is a plan view of a display panel according to another alternative embodiment of the invention.
Figure 7A:
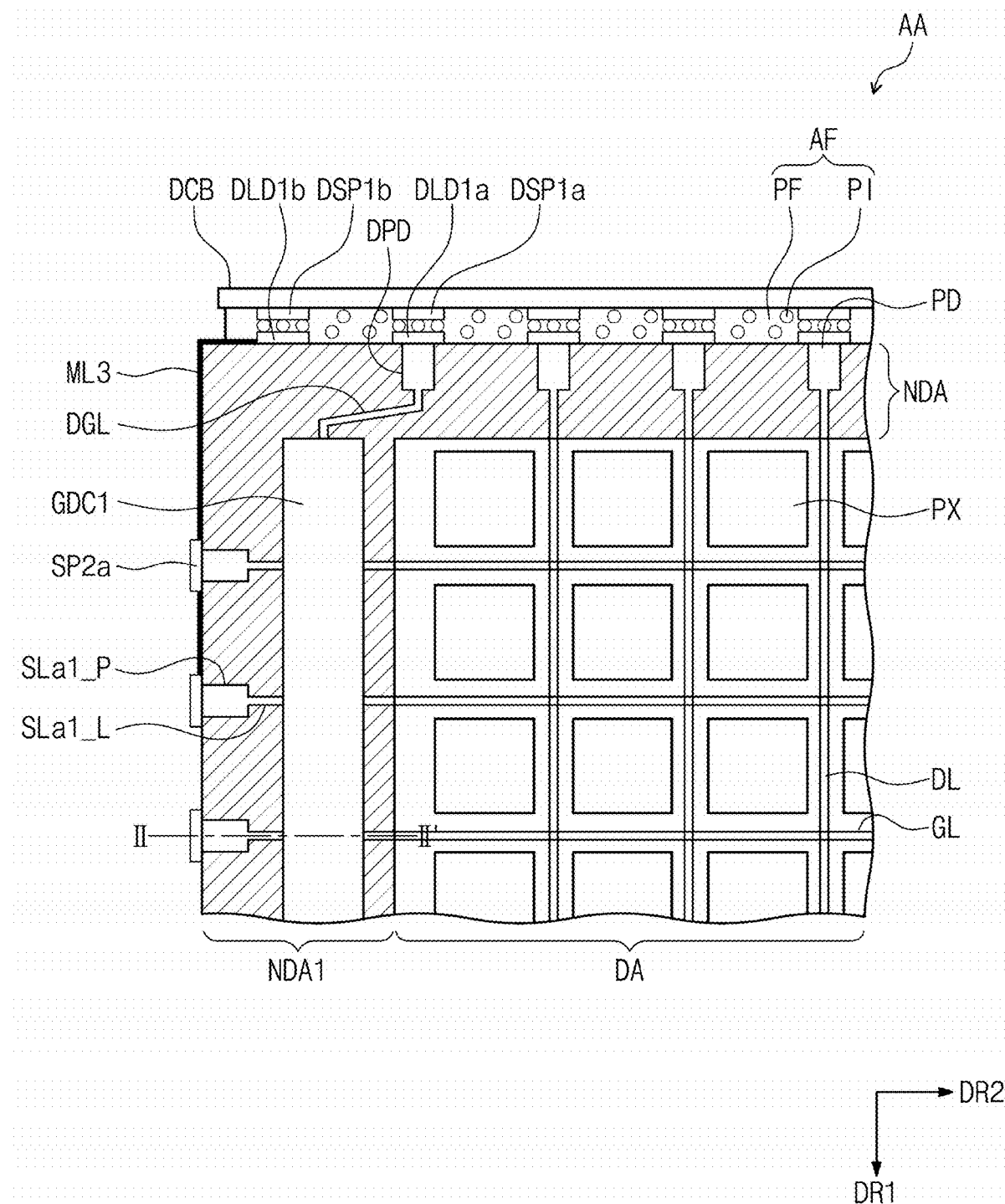
FIG. 7A is a partial enlarged view of a region BB in FIG. 6.
Figure 7B:
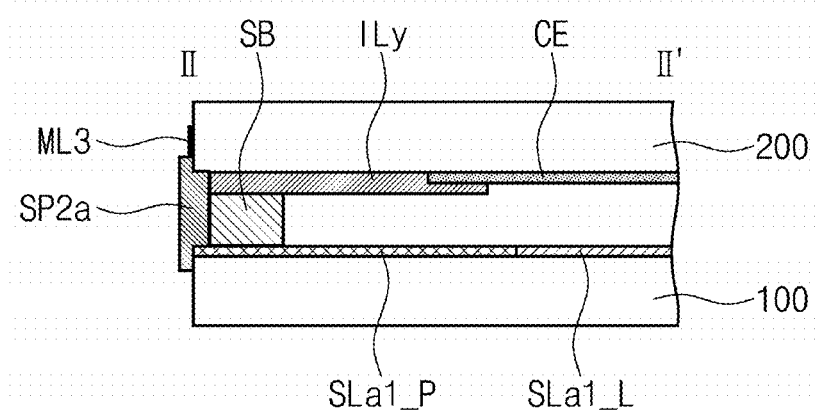
FIG. 7B is a cross-sectional view taken along line II-IF of FIG. 7A.

FIG. 6 is a plan view of a display device according to another alternative embodiment of the invention. FIG. 7A is a partial enlarged view of a region BB in FIG. 6, and FIG. 7B is a cross-sectional view taken along line II-IF of FIG. 7A. FIG. 8 is a plan view illustrating a control signal line disposed on a side surface of a display panel according to another alternative embodiment of the invention.

In an embodiment, referring to FIGS. 6 to 7B, the first gate driving unit GDC1 and the second gate driving unit GDC2 may be spaced apart from each other and face each other in the first direction DR1. In such an embodiment, the first gate driving unit GDC1 and the second gate driving unit GDC2 may be disposed on a first non-display area NDA1 and a second non-display area NDA2, respectively, with the display area DA therebetween.

In an embodiment, at least one data driving unit, e.g., a first adjacent data driving unit DDC1a, of the data driving units may be connected to the first gate driving unit GDC1a. In such an embodiment, the first adjacent data driving unit DDC1a may be a data driving unit disposed adjacent to the second side surface Sd2. In an embodiment, at least one data driving unit, e.g., the second adjacent data driving unit DDC2a, of the data driving units may be connected to the second gate driving unit GDC2a. In such an embodiment, the second adjacent data driving unit DDC2a may be a data driving unit disposed adjacent to the third side surface Sd3.

The gate control signal outputted from the signal control unit SC (refer to FIG. 1) may be transmitted to each of the first gate driving unit GDC1a and the second gate driving unit GDC2a through the first adjacent data driving unit DDC1a and the second adjacent data driving unit DDC2a, respectively.

According to an embodiment of the invention, the first adjacent data driving unit DDC1a may be electrically connected to the first gate driving unit GDC1a through a first control signal line ML3. The first control signal line ML3 may be disposed on the first side surface Sd1 and the second side surface Sd2. The first control signal line ML3 may electrically connect the first data circuit board DCB1a of the first adjacent data driving unit DDC1a to the first gate driving unit GDC1a. A second control signal line ML4 may be disposed on the first side surface Sd1 and the third side surface Sd3. The second control signal line ML4 may electrically connect the second data circuit board DCB2a of the second adjacent data driving unit DDC2a to the second gate driving unit GDC2a.

In an embodiment, a plurality of first signal lines SLa1 to SLan are disposed on the first non-display area NDA1 and connected to the first gate driving unit GDC1. A plurality of second signal lines SLb1 to SLbn are disposed on the second non-display area NDA2 and connected to the second gate driving unit GDC2.

In an embodiment, a structure of the second gate driving unit GDC2 and signal lines connected thereto may be substantially the same as that of the first gate driving unit GDC1 and the signal lines connected thereto. Accordingly, for convenience of description, the first gate driving unit GDC1 and the signal lines connected thereto will hereinafter be described in detail with reference to FIGS. 7A and 7B.

Referring to FIGS. 7A and 7B, in an embodiment, the first signal lines SLa1 to SLan may be provided on the same substrate with the pixels PX disposed on the first substrate 100. In such an embodiment, each of the first signal lines SLa1 to SLan includes a connecting line SLa1_L and a connecting pad SLa1_P. According to an embodiment, the number of the first signal lines SLa1 to SLan may correspond to correspond to the number of the gate lines GL1 to GLn.

Second side electrodes SP2a may be disposed on the second side surface Sd2 and directly connected to the connecting pads of the first signal lines SLa1 to SLan, respectively. The second side electrodes SP2a are directly connected to the first control signal line ML3 on the second side surface Sd2. The second side electrodes SP2a may be supported by the adhesion member SB. A method of providing each of the second side electrodes SP2a on the second side surface Sd2 may include at least one of various methods such as a method of depositing a metal material and then forming an electrode by using laser or a silk screen method.

In an embodiment, as illustrated in FIG. 8, each of the second side electrodes SP2a has an end portion disposed on the first sub-side surface Sd2a corresponding to the first substrate 100 of the second side surface Sd2 and an opposing other end portion disposed on the second sub-side surface Sd2b corresponding to the second substrate 200 of the second side surface Sd2. In such an embodiment, although not shown, a gap OP between the second side electrodes SP2a may be filled by a dam. The dam filling the gap between the second side electrodes SP2a may have various structures.

In an embodiment, as shown in FIG. 7A, the first data circuit board DCB1 of the first adjacent data driving unit DDC1 may include at least two dummy line electrodes DLD1a and DLD1b.

In such an embodiment, the first dummy line electrodes DLD1a is connected to a first dummy side electrode DSP1a disposed on the first side surface Sd1 through an anisotropic conductive film AF. The first dummy side electrode DSP1a is connected to a dummy pad DPD disposed on the first substrate 100. The data dummy pad DPD is connected to the first gate driving unit GDC1 through a dummy signal line DGL.

In such an embodiment, the gate control signal outputted from the signal control unit SC is transmitted to the first dummy side electrode DSP1a through the first dummy line electrode DLD1a. The gate control signal transmitted to the first dummy side electrode DSP1*a* may be transmitted to the first gate driving unit GDC1 through the dummy signal line DGL.

In an embodiment, the gate control signal outputted from the signal control unit SC is transmitted to the second dummy side electrode DSP1*b* through the second dummy line electrode DLD1*b*. The gate control signal transmitted to the second dummy side electrode DSP1*b* is transmitted to the second side electrodes SP2*a* through the first control signal line ML3. The gate control signal transmitted to the second dummy side electrode SP2*a* may be transmitted to the first gate driving unit GDC1 through the first signal lines SLa1 to SLan.

As described above, according to an embodiment of the invention, a portion of the gate control signal may be transmitted to the gate driving unit through the side surface of the display panel DP. In a conventional display device, a plurality of signal lines for transmitting the gate signal to the gate driving unit are typically disposed on the first non-display area NDA1. In an embodiment of the display device DD2 according to the invention, at least one signal line of the plurality of signal lines transmitting the gate signal is disposed on the side surface of the display panel DP, such that the first non-display area NDA1 may be reduced.

Accordingly, the display area DA of the display panel DP, on which an image is substantially displayed, may be increased.

Figure 9:
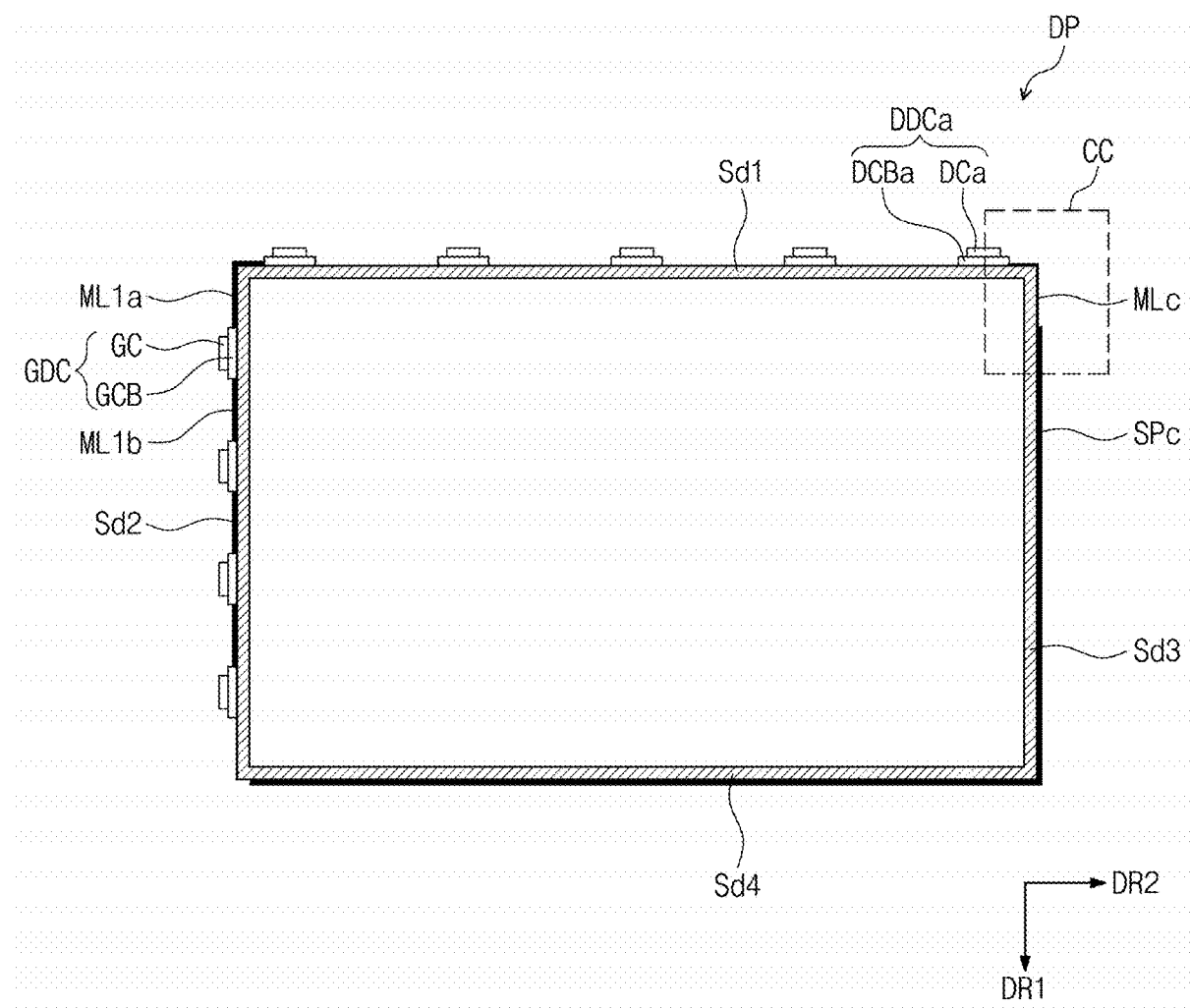
FIG. 9 is a plan view of a display panel according to another alternative embodiment of the invention.
Figure 10:
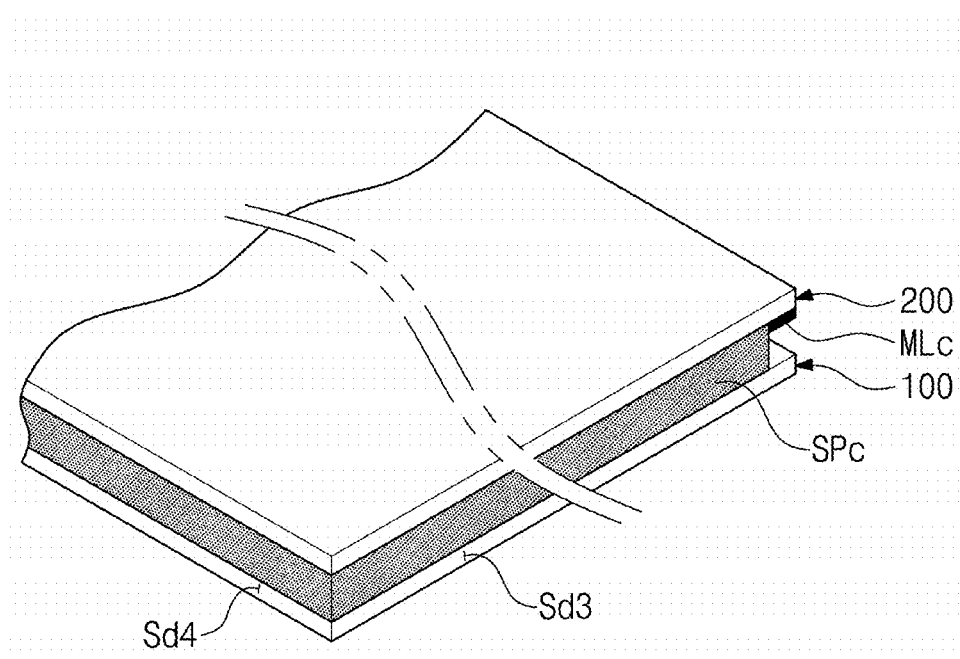
FIG. 10 is a perspective view of the display panel in FIG. 9 according to another alternative embodiment of the invention.

FIG. 9 is a plan view of a display device according to another alternative embodiment of the invention. FIG. 10 is a perspective view of the display panel in FIG. 9 according to another alternative embodiment of the invention.

The display panel DP in FIG. 9 is substantially the same as the display panel DP in FIG. 2A, except that a side common electrode SPc disposed on the third and fourth side surfaces Sd3 and Sd4 and connected to the common electrode CE are added. The same or like elements shown in FIG. 9 have been labeled with the same reference characters as used above to describe the embodiments of display device described above with reference to FIG. 2A, and any repetitive detailed description thereof will hereinafter be omitted or simplified.

According to an embodiment, a tape carrier package ("TCP") type gate driving unit is provided, and the gate driving unit may be disposed on only the second side surface Sd2. In such an embodiment, the TCP type gate driving unit is not disposed on the third side surface Sd3.

According to an embodiment, where the TCP type gate driving unit is disposed on the second side surface Sd2, an ASG type gate driving unit may be disposed adjacent to the third side surface Sd3 on the first substrate 100.

Referring to FIGS. 9 and 10, the side common electrode SPc may be disposed on the third side surface Sd3 and the fourth side surface Sd4. A method of providing the side common electrode SPc on the first and third side surface Sd1 and Sd3 of the display panel DP may include a method of depositing a metal material and then forming an electrode by using laser or a silk screen method. Through such a method, the side common electrode SPc may be disposed on the first and third side surfaces Sd1 and Sd3 to connect the first substrate 100 and the second substrate 200.

A control signal line MLc may be disposed on the first side surface Sd1 and the third side surface Sd3 to connect the side common electrode SPc to a data driving unit DDCa disposed adjacent to the third side surface Sd3 of the side common electrode SPc.

Figure 11:
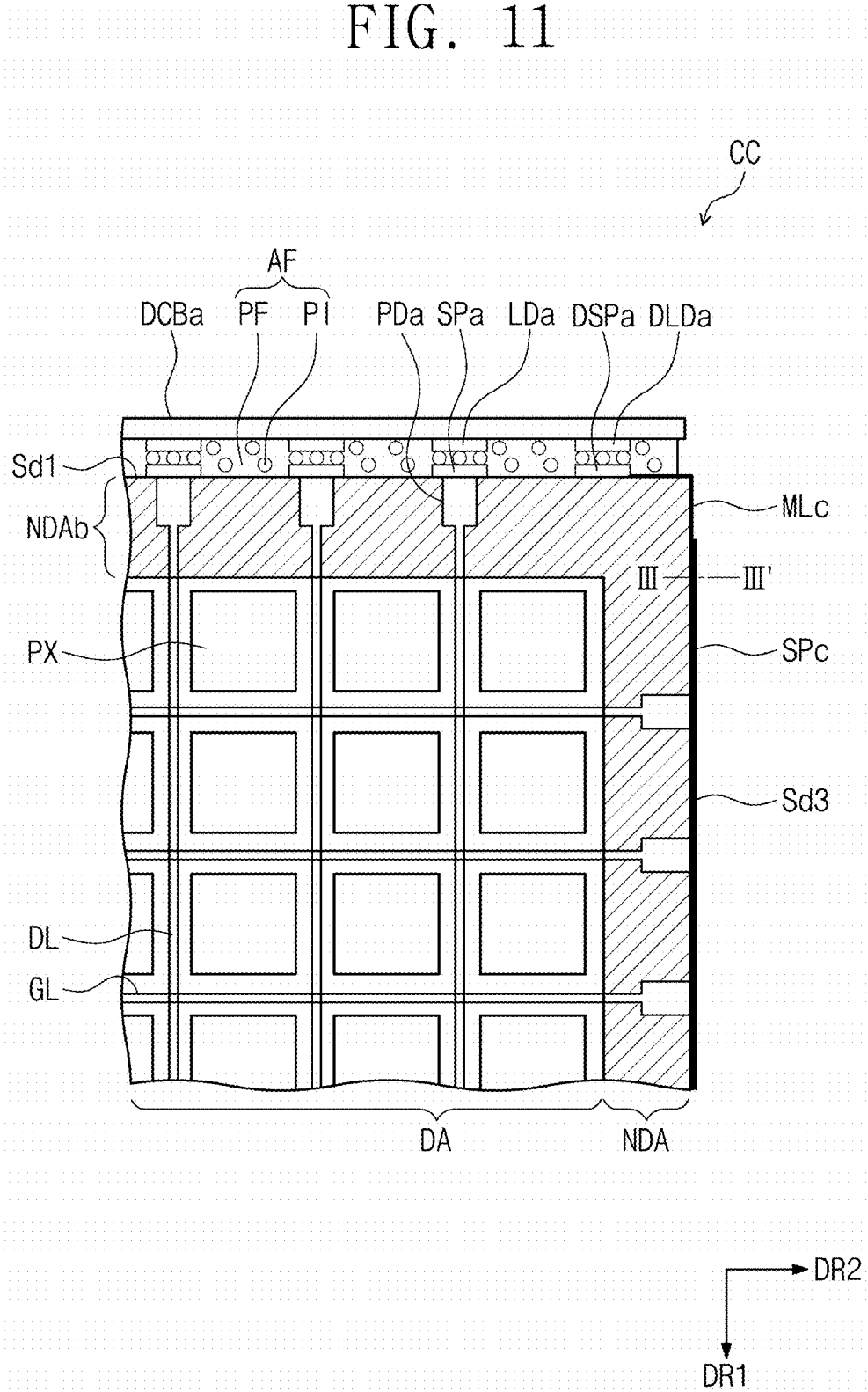
FIG. 11 is a partial enlarged view of a region CC in FIG. 9.
Figure 12:
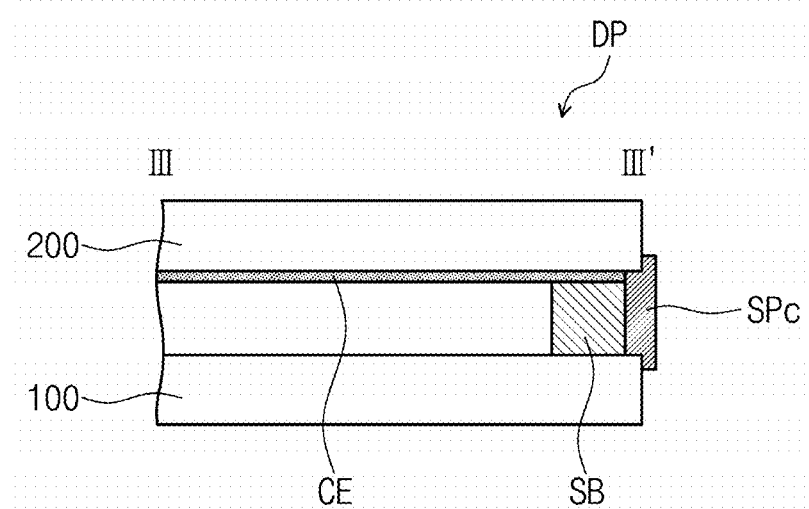
FIG. 12 is a cross-sectional view taken along line of FIG. 11.

FIG. 11 is a partial enlarged view of a region CC in FIG. 9; FIG. 12 is a cross-sectional view taken along line III-III' of FIG. 11;

Referring to FIGS. 11 and 12, in an embodiment, the data circuit board DCBa includes a plurality of line electrodes LDa and at least one dummy line electrode DLDa. The line electrodes LDa are respectively electrically connected to the side electrodes Spa disposed on the first side surface Sd1 through an anisotropic conductive film AF. The first side electrodes Spa are directly connected to the data pads PDa.

According to an embodiment of the invention, the dummy line electrode DLDa is connected to a dummy side electrode DSPa through the anisotropic conductive film AF. The dummy side electrode DSPa may be electrically connected to the side common electrode SPc through the control signal line MLc. The side common electrode SPc may be directly connected to the common electrode CE disposed on the second substrate 200.

In an embodiment, the side common electrode SPc may have a portion disposed on the third side surface Sd3 and another portion disposed between the first substrate 100 and the second substrate 200. The remaining portion of the side common electrode SPc may be directly connected to the common electrode CE disposed on the second substrate 200.

In such an embodiment, as described above, the adhesion member SB may be disposed along the edge of the display panel DP to support the side common electrode SPc.

In an embodiment, where the display panel DP is an organic light emitting display panel, the above-described adhesion member SB may be omitted. In such an embodiment, the dam supporting the side common electrode SPc may be disposed along the edge of the display panel DP between the first substrate 100 and the second substrate 200.

In an embodiment, although not shown, a light shielding material such as black matrix may be disposed on the non-display area NDA of the second substrate 200 to prevent light from emitting to the outside.

In the display device according to an embodiment of the invention, a common voltage may be provided to the common electrode CE through the control signal line MLc and the side common electrode SPc. As a result, an additional signal line for providing the common voltage to the common electrode CE may not be disposed on the non-display area NDA of the first substrate 100. Accordingly, the display area DA of the display panel DP, on which an image is displayed, may be increased.

According to embodiments of the invention, the control signal line for connecting the plurality of gate driving units to the plurality of data driving units may be disposed on the side surface of the display panel. In such embodiments, the control signal line may not be disposed on the non-display area of the display panel, but be disposed on the side surface of the display panel to reduce the non-display area. Thus, the display area of the display panel may be increased.

The invention has been particularly shown and described with reference to exemplary embodiments thereof. While specific terms were used, they were not used to limit the meaning or the scope of the invention described in claims, but merely used to explain the invention. Accordingly, a person having ordinary skill in the art will understand from the above that various modifications and other equivalent embodiments are also possible. Hence, the real protective scope of the invention shall be determined by the technical scope of the accompanying claims.

What is claimed is:

1. A display device comprising:

a display panel having a top surface, a bottom surface facing the top surface, and a plurality of side surfaces which connects the top surface to the bottom surface, wherein the display panel comprises: a first substrate comprising a plurality of pixels and on which the bottom surface is defined; and a second substrate disposed opposite to the first substrate and on which the top surface is defined;

a plurality of data driving units disposed on a first side surface of the side surfaces;

a plurality of gate driving units disposed on the first substrate;

a plurality of side electrodes disposed on a second side surface of the side surfaces, which is connected to the first side surface, wherein the side electrodes are connected to the gate driving units; and a control signal line disposed on the first and second side surfaces to connect a first adjacent data driving unit of the data driving units, which is disposed adjacent to the second side surface, to the side electrodes.

2. The display device of claim 1, further comprising:

a connecting pad disposed in the first substrate, wherein the connecting pad connects the gate driving units to the side electrodes, and each of the side electrodes has one portion disposed on the second side surface and the other portion disposed between the first and second substrates and is connected to the connecting pad.

3. The display device of claim 1, further comprising:

a dummy signal line disposed in the first substrate, wherein the dummy signal line connects the gate driving units to the first adjacent data driving unit.

4. The display device of claim 1, further comprising:

a side common electrode disposed on a third side surface of the side surfaces, which is connected to the first side surface; and a common power line disposed on the first and third side surfaces to connect a second adjacent data driving unit of the data driving units, which is disposed adjacent to the third side surface, to the side common electrode.

5. The display device of claim 4, wherein the first substrate further comprises a plurality of pixels, the second substrate comprises a common electrode, and the side common electrode is connected to the common electrode.

* * * * *